(12) United States Patent
Son et al.

(10) Patent No.: US 12,273,998 B2
(45) Date of Patent: Apr. 8, 2025

(54) SUBSTRATE FOR IMAGE SENSOR

(71) Applicant: LG INNOTEK CO., LTD., Seoul (KR)

(72) Inventors: Young Joon Son, Seoul (KR); Jee Heum Paik, Seoul (KR); Hye Eun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/768,144

(22) PCT Filed: Oct. 8, 2020

(86) PCT No.: PCT/KR2020/013778
§ 371 (c)(1),
(2) Date: Apr. 11, 2022

(87) PCT Pub. No.: WO2021/071303
PCT Pub. Date: Apr. 15, 2021

(65) Prior Publication Data
US 2024/0244746 A1    Jul. 18, 2024

(30) Foreign Application Priority Data

Oct. 11, 2019  (KR) .................. 10-2019-0126183

(51) Int. Cl.
  *H05K 1/11*   (2006.01)
  *H04N 23/68*  (2023.01)
(52) U.S. Cl.
  CPC ............ *H05K 1/11* (2013.01); *H04N 23/687* (2023.01); *H05K 2201/10083* (2013.01)
(58) Field of Classification Search
  CPC ........... H05K 1/11; H05K 2201/10083; H05K 1/0216; H05K 1/111; H05K 2201/10121;
  (Continued)

(56) References Cited

U.S. PATENT DOCUMENTS 7,400,824 B2   7/2008   Seo
8,605,160 B2  12/2013   Kwon et al.
(Continued)

FOREIGN PATENT DOCUMENTS

CN   108780207 A   11/2018
JP     6-45364 U    6/1994
(Continued)

OTHER PUBLICATIONS

International Search Report (PCT/ISA/210) issued in PCT/KR2020/013778 mailed on Jan. 20, 2021.

*Primary Examiner* — Nhan T Tran
(74) *Attorney, Agent, or Firm* — Birch, Stewart, Kolasch & Birch, LLP

(57) ABSTRACT

A substrate according to an embodiment includes an insulating layer; a first pattern portion disposed on the insulating layer; and a second pattern portion disposed on the insulating layer and spaced apart from the first pattern portion, wherein the insulating layer includes a first insulating portion including a first open region; and a second insulating portion disposed to surround an outside of the first insulating part and spaced apart from the first insulating portion with a second open region therebetween; wherein the first pattern portion includes a first lead pattern portion disposed on the first insulating portion; a second lead pattern portion disposed on the second insulating portion; and a connection pattern portion having one end connected to the first lead pattern portion and the other end connected to the second lead pattern portion, and disposed on the second open region; wherein the connection pattern portion includes a bent portion positioned on a corner of the second open region.

20 Claims, 21 Drawing Sheets

(58) Field of Classification Search
CPC ......... H05K 2201/10371; H05K 1/147; H04N 23/687; H04N 23/55; H04N 23/57; G02B 27/646; G02B 7/08; G02B 7/04; G03B 30/00

See application file for complete search history.

(56) References Cited

U.S. PATENT DOCUMENTS

| | | | |
|---|---|---|---|
| 9,041,820 B2 * | 5/2015 | Kim | H04N 23/57 |
| | | | 348/208.99 |
| 10,039,437 B2 | 8/2018 | Tanahashi | |
| 10,924,675 B2 | 2/2021 | Hubert et al. | |
| 11,582,388 B2 | 2/2023 | Hubert et al. | |
| 2002/0050788 A1 | 5/2002 | Kimura et al. | |
| 2006/0067660 A1 | 3/2006 | Seo | |
| 2011/0096178 A1 * | 4/2011 | Ryu | G03B 5/02 |
| | | | 348/208.2 |
| 2016/0241785 A1 | 8/2016 | Chiouchang et al. | |
| 2017/0224203 A1 | 8/2017 | Tanahashi | |
| 2018/0171991 A1 * | 6/2018 | Miller | F16F 15/06 |
| 2019/0020822 A1 | 1/2019 | Shanna et al. | |
| 2019/0141248 A1 * | 5/2019 | Hubert | H05K 1/189 |
| 2021/0006720 A1 * | 1/2021 | Enta | H04N 23/45 |
| 2021/0168289 A1 | 6/2021 | Hubert et al. | |
| 2023/0199313 A1 | 6/2023 | Hubert et al. | |

FOREIGN PATENT DOCUMENTS

| | | |
|---|---|---|
| JP | 2006-91473 A | 4/2006 |
| JP | 2013-72967 A | 4/2013 |
| JP | 2019-512734 A | 5/2019 |
| KR | 10-2012-0122466 A | 11/2012 |
| KR | 10-2015-0042681 A | 4/2015 |
| WO | WO 2016/143179 A1 | 9/2016 |
| WO | WO 2018/112436 A1 | 6/2018 |

* cited by examiner

[FIG. 1]
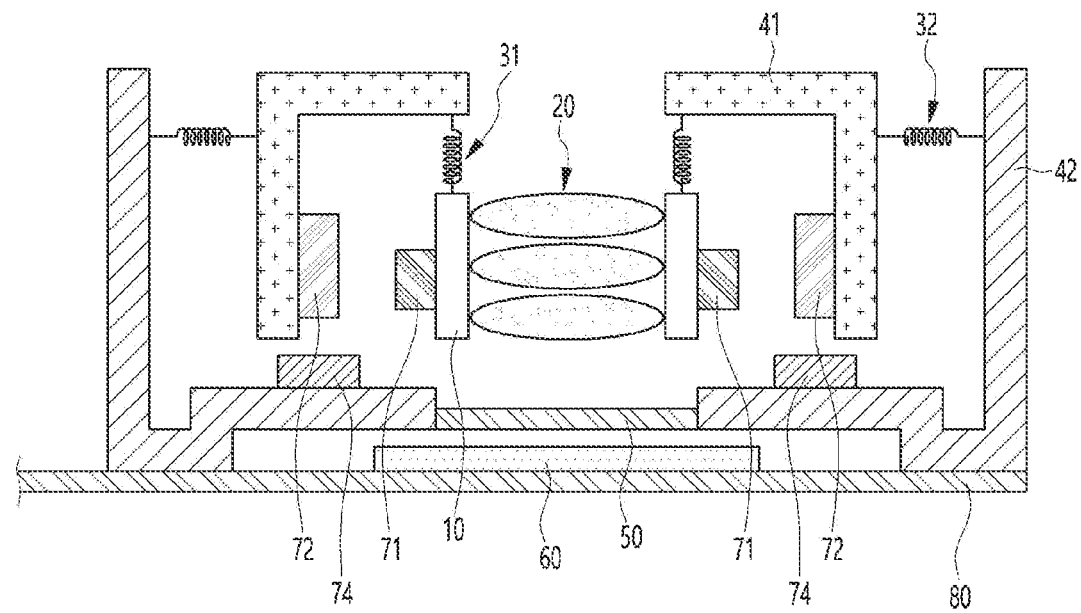
[FIG. 2]
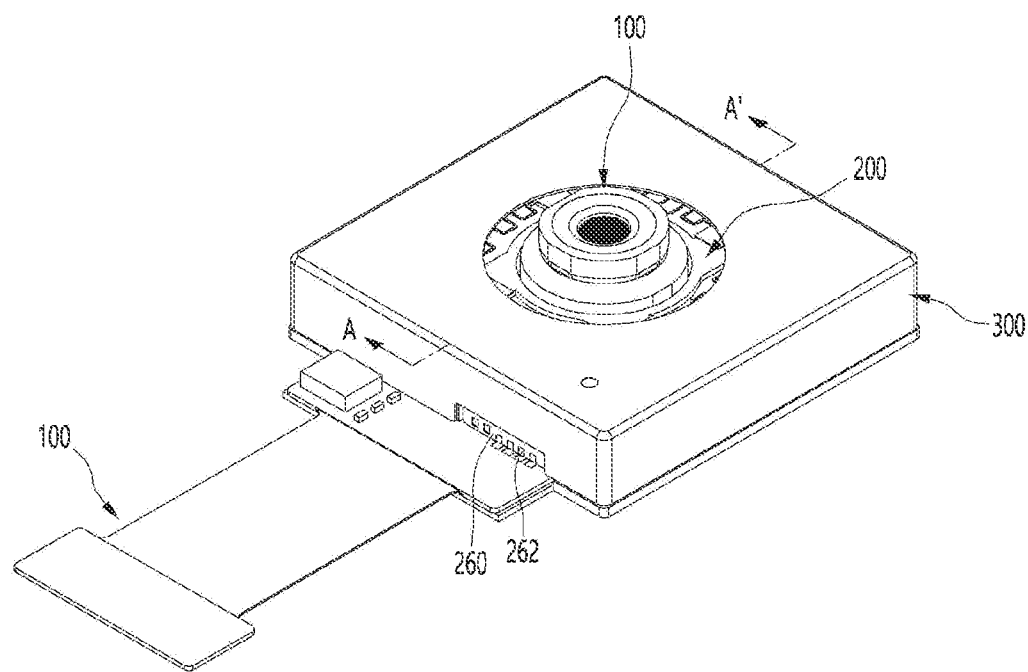

[FIG. 3]
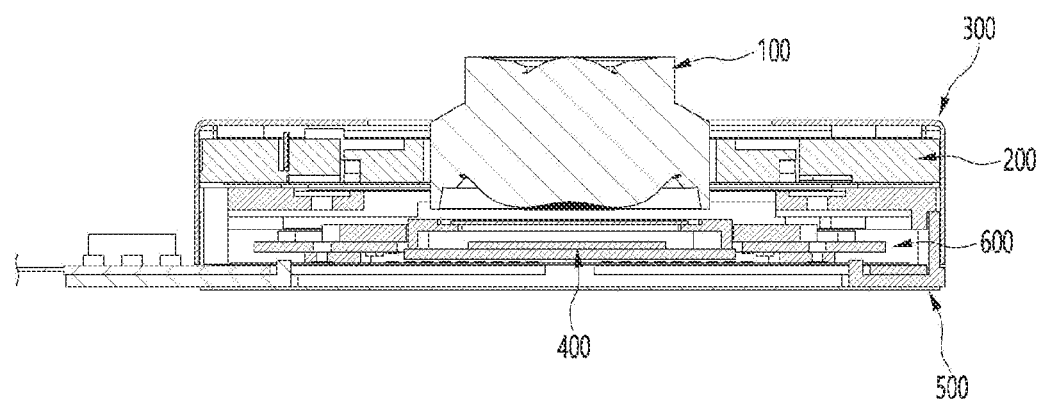

[FIG. 4]
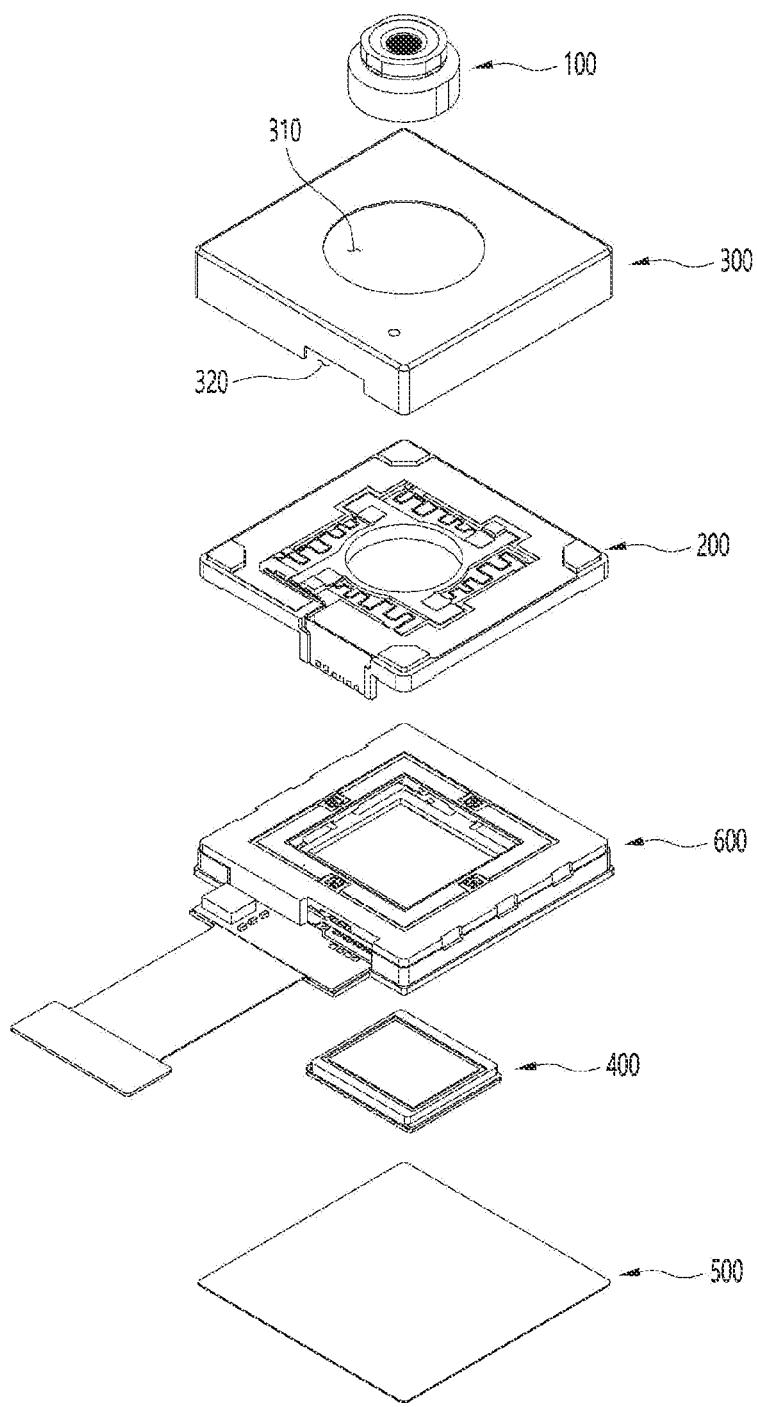

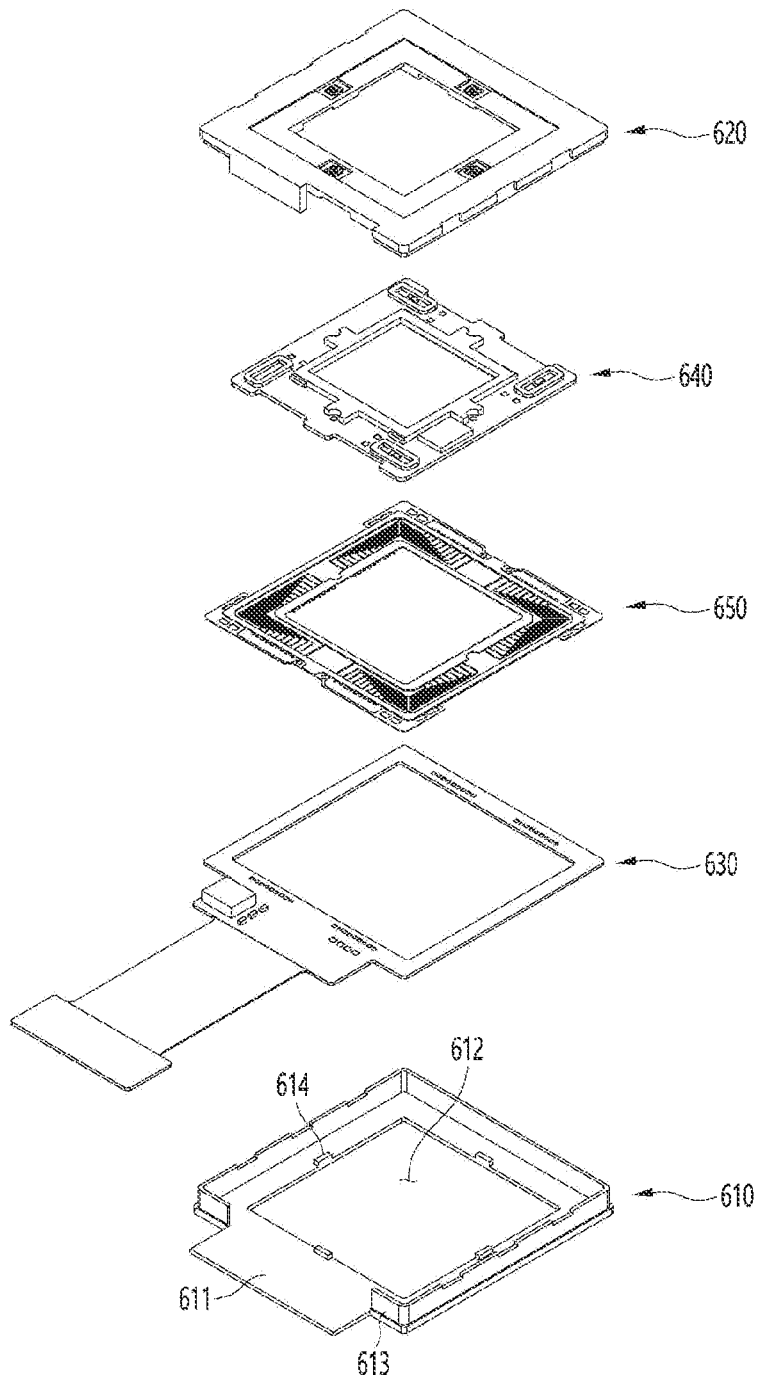
[FIG. 5]

[FIG. 6]
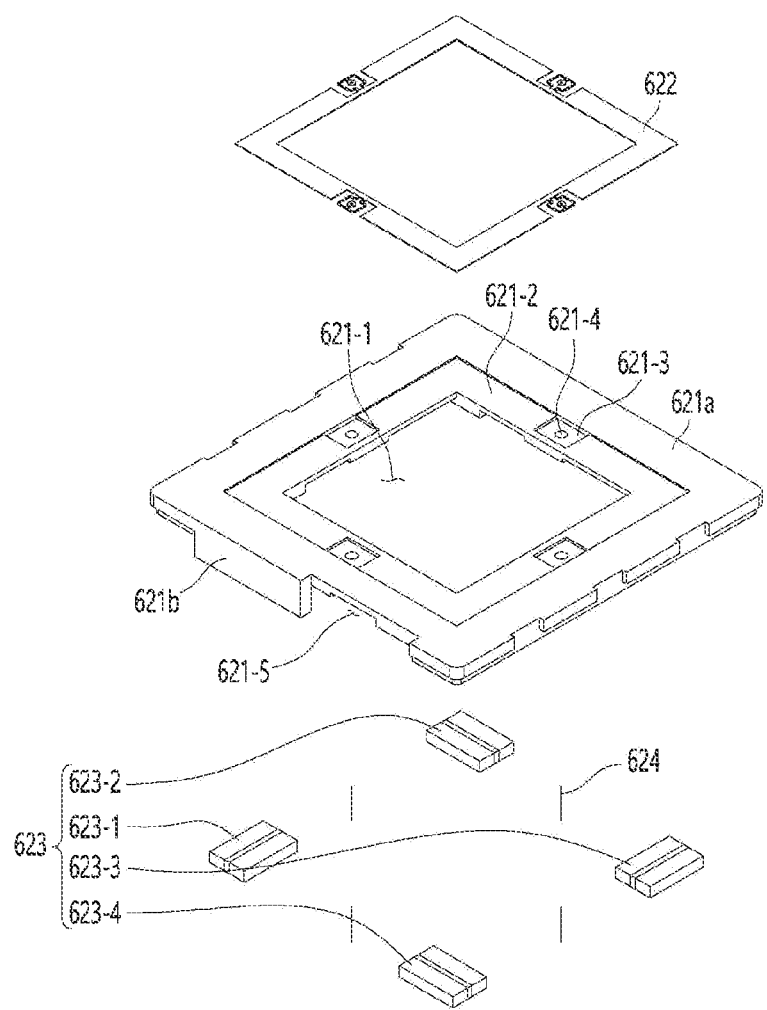

[FIG. 7]
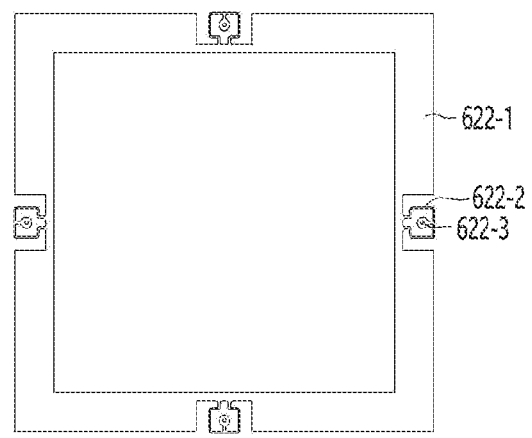

[FIG. 8]
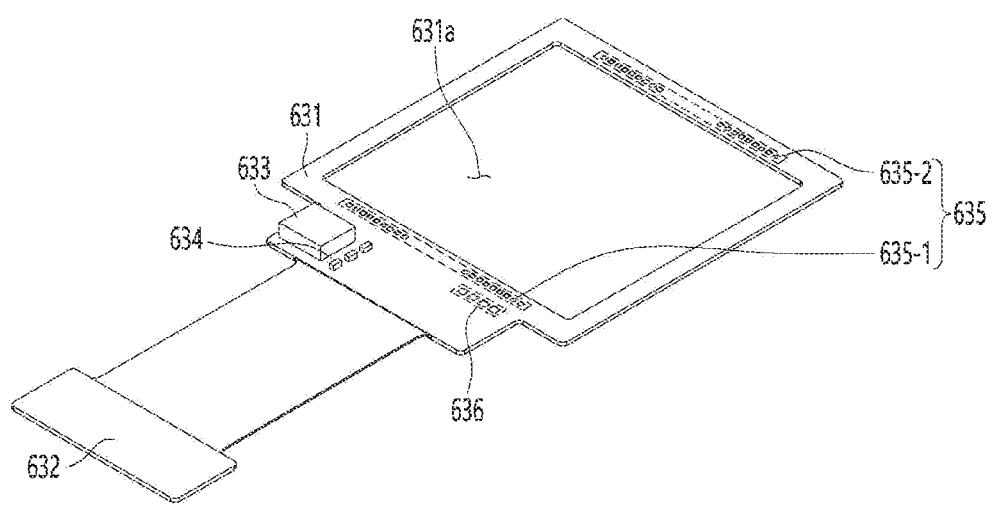

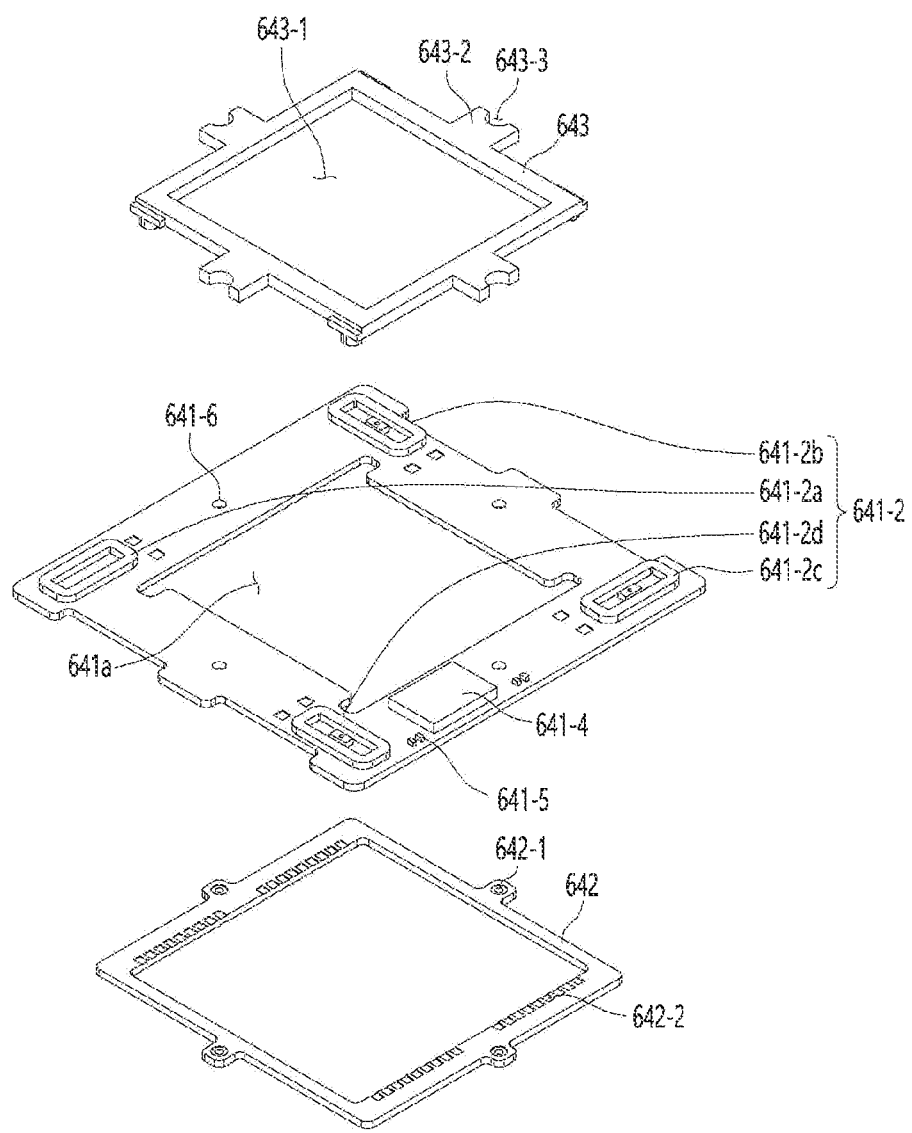
[FIG. 9]

[FIG. 10]
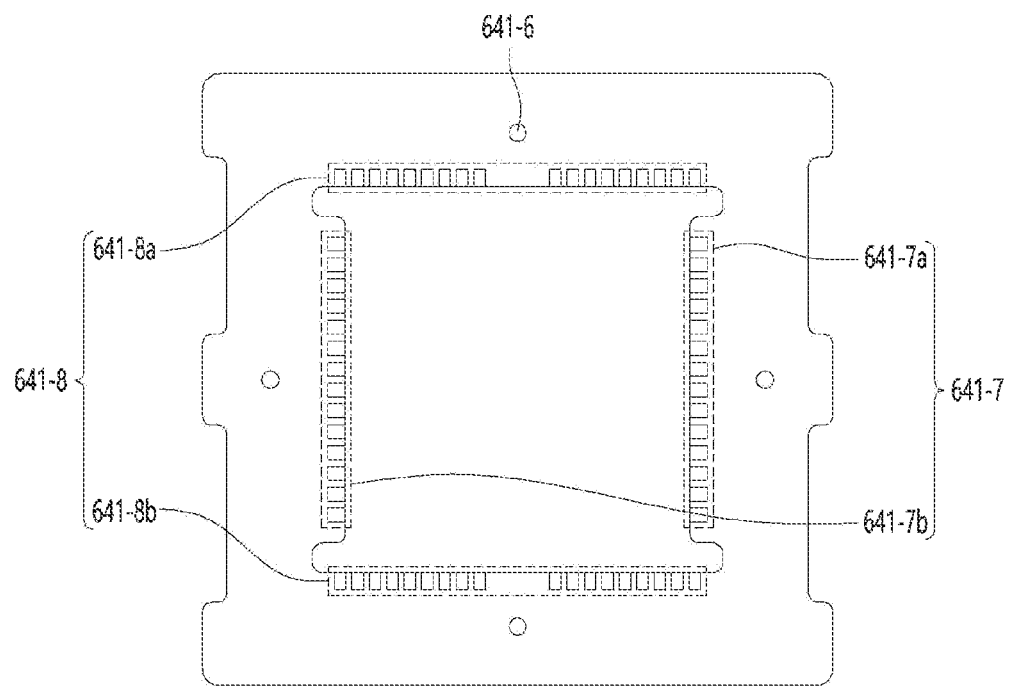

[FIG. 11]
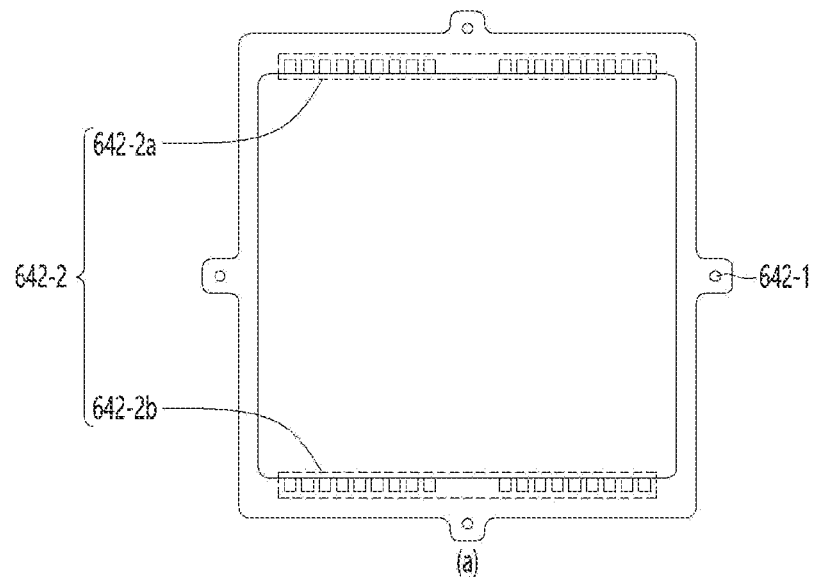
(a)
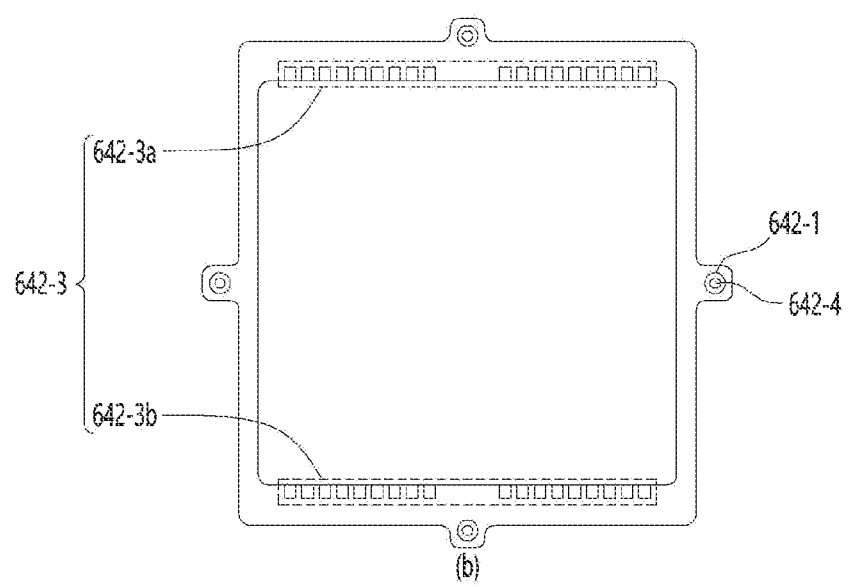
(b)

[FIG. 12]
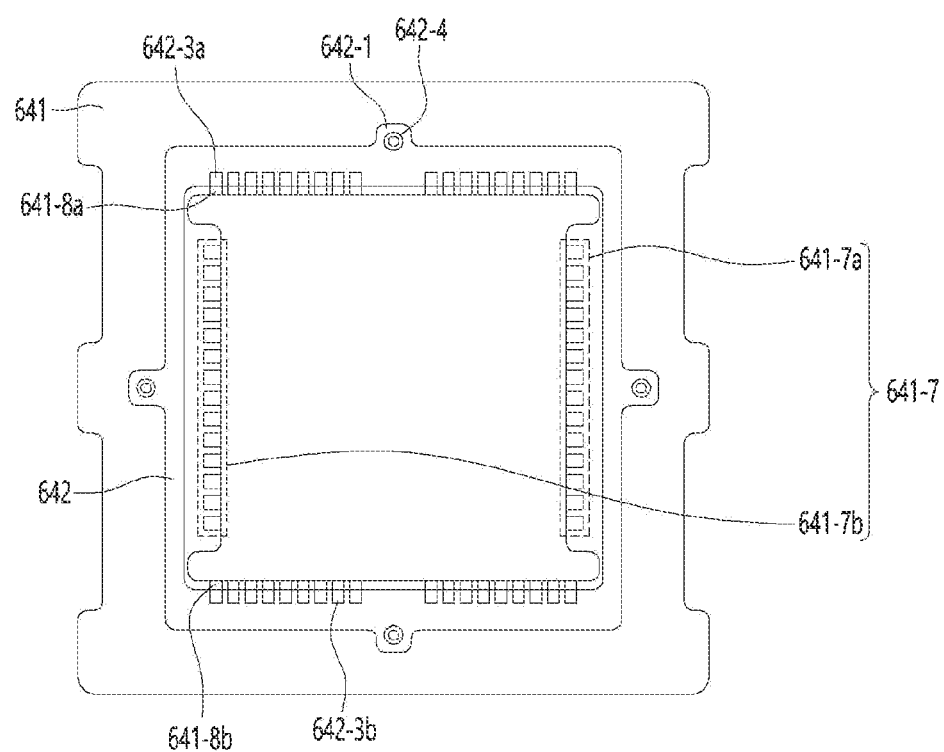

[FIG. 13]
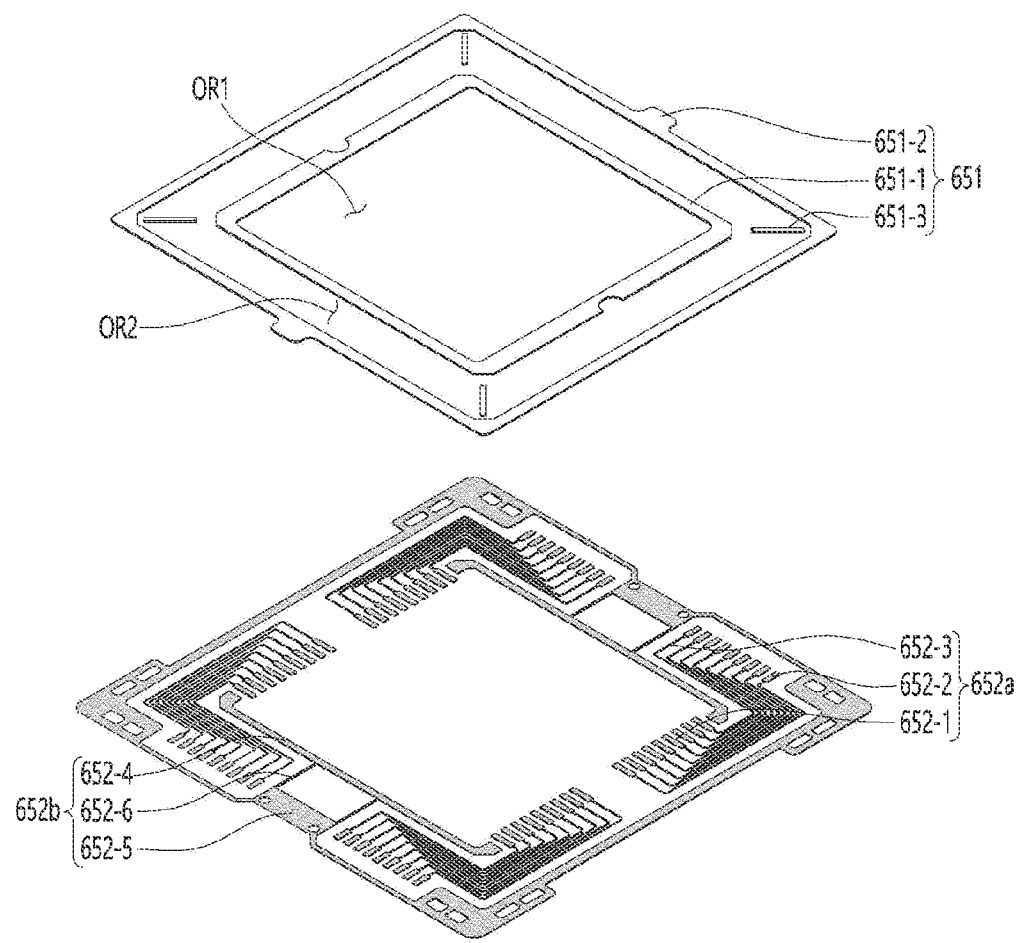

[FIG. 14a]
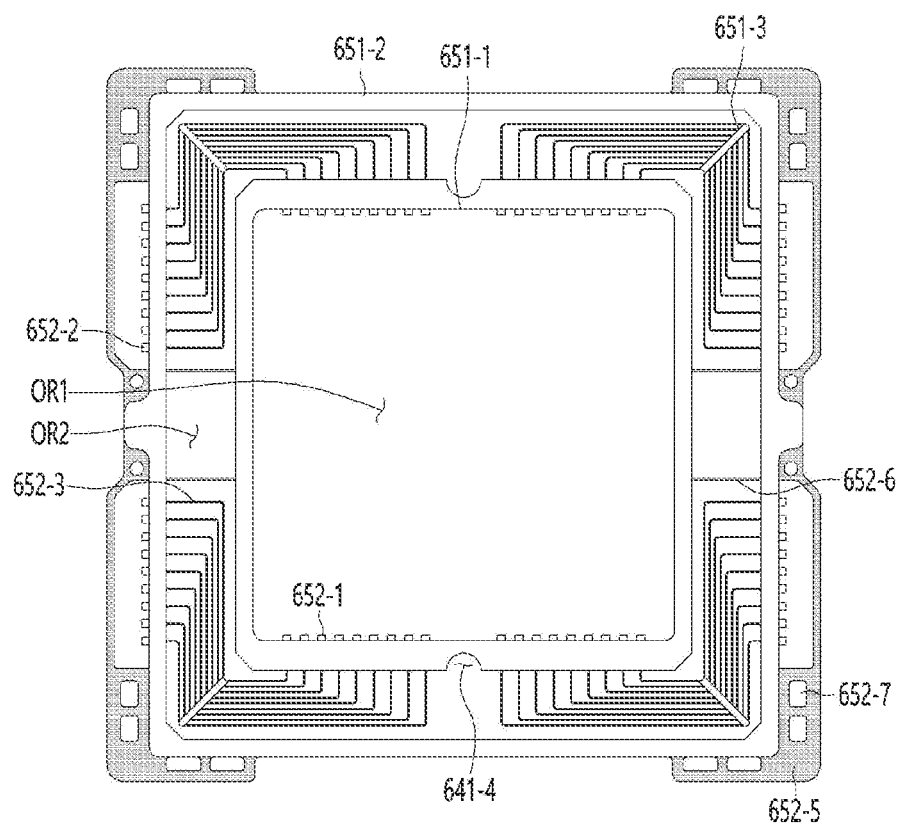

[FIG. 14b]
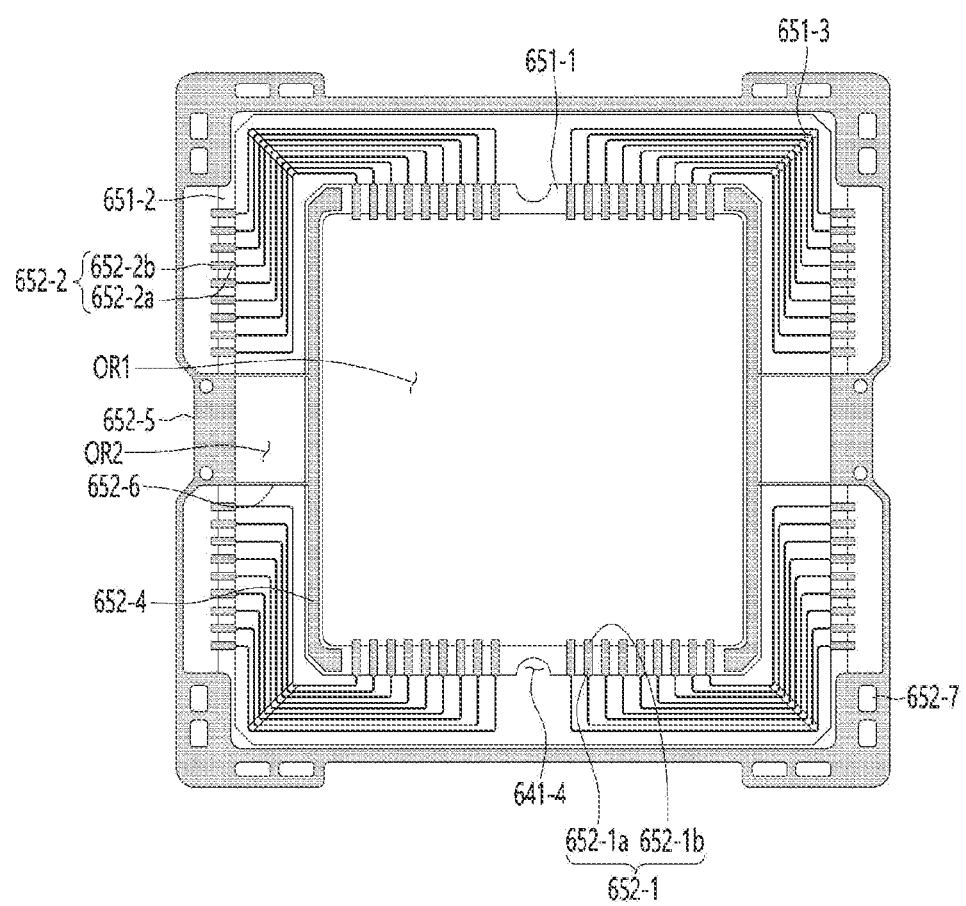

[FIG. 14c]
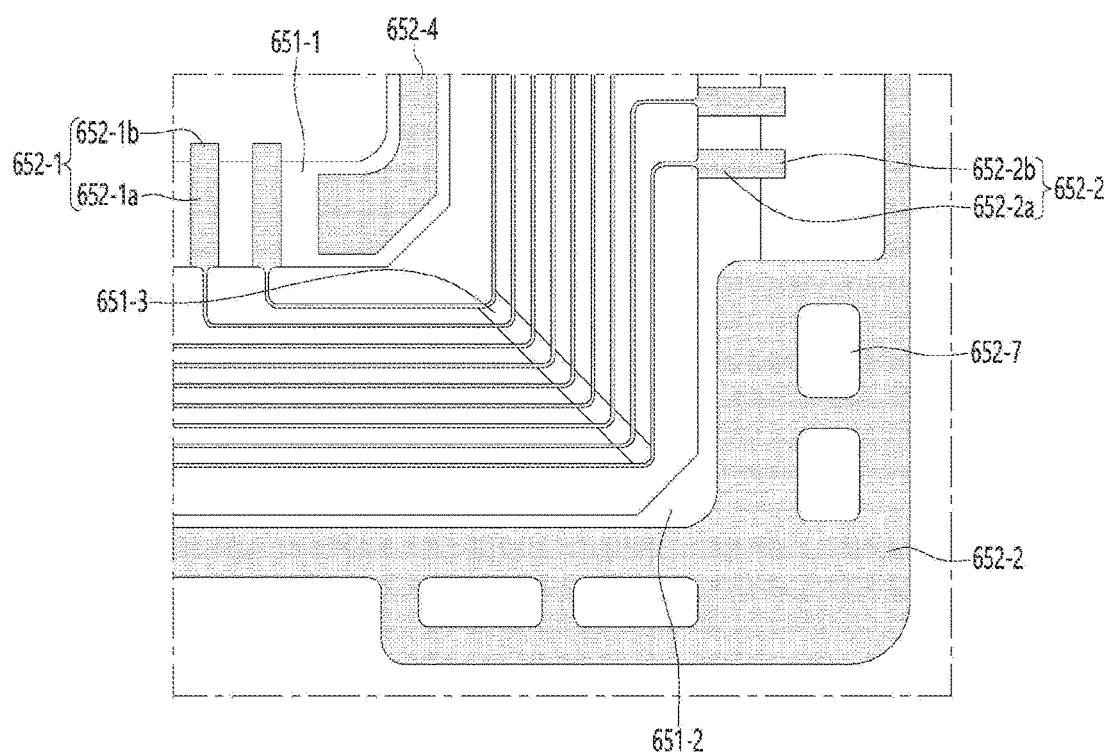

[FIG. 15]
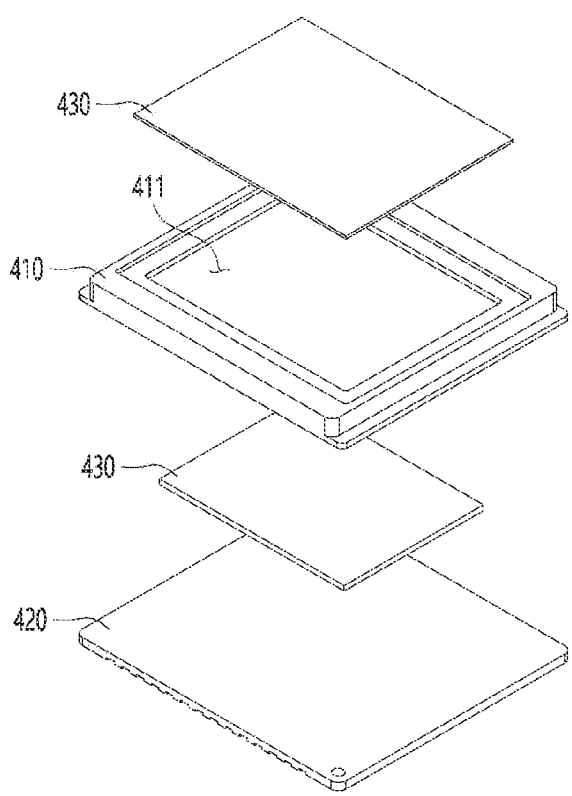

[FIG. 16a]
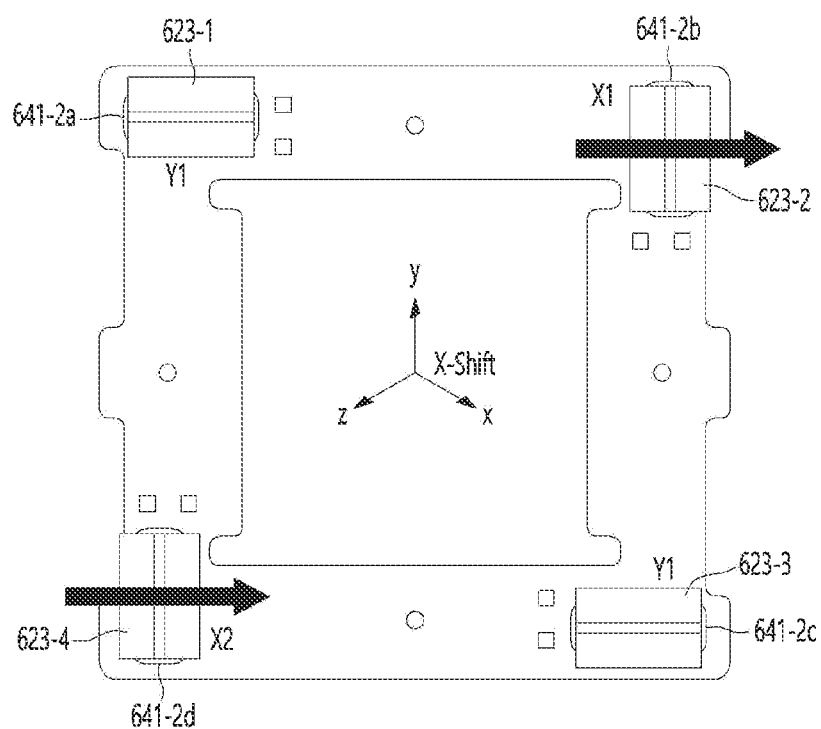

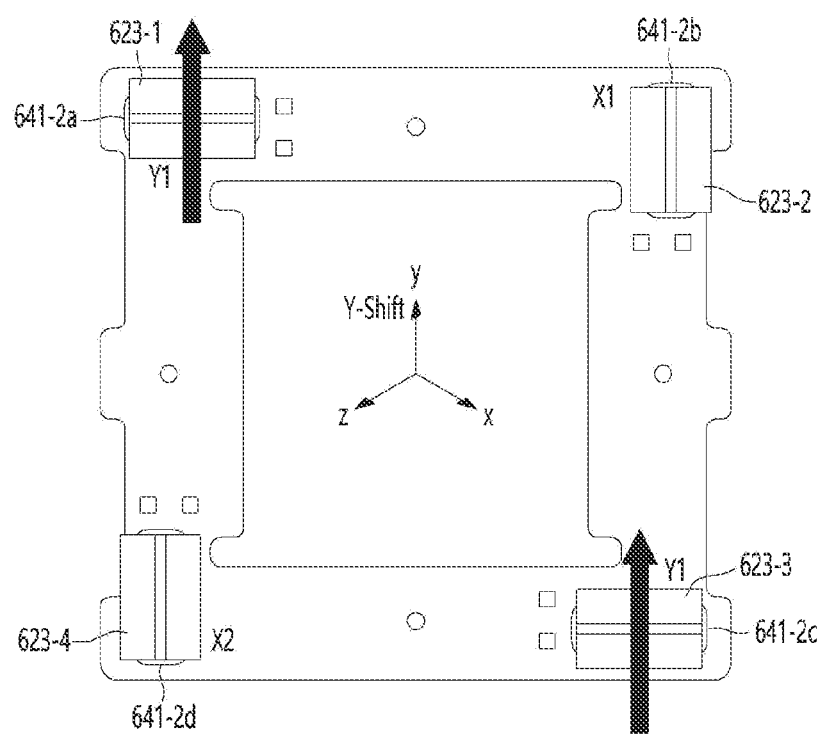
[FIG. 16b]

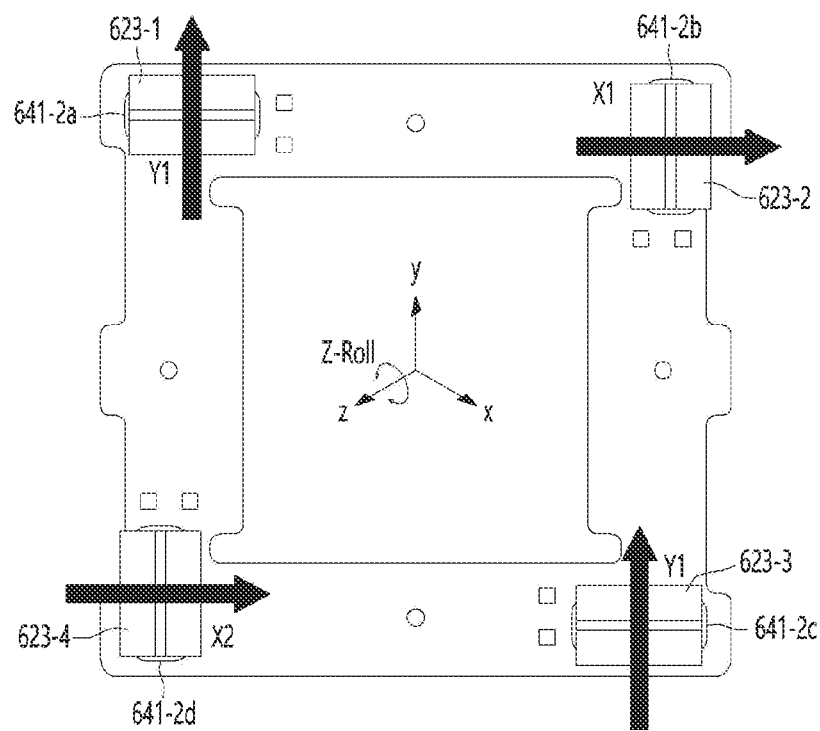
[FIG. 16c]

[FIG. 17]
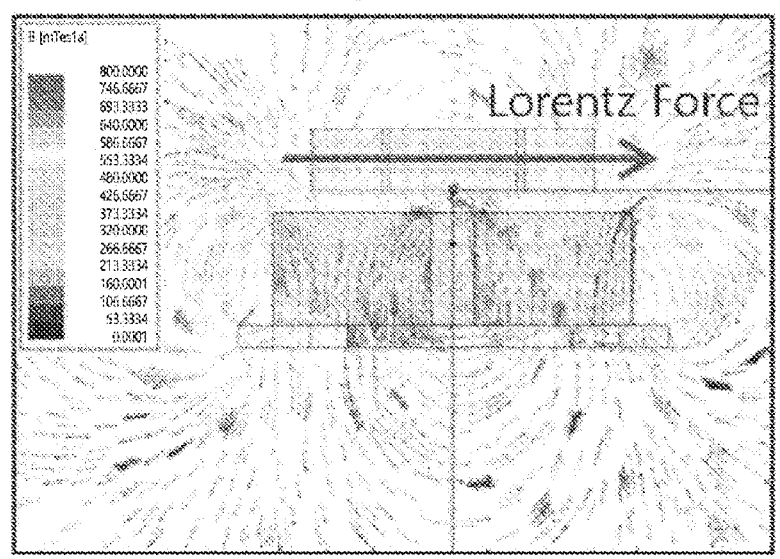

[FIG. 18]
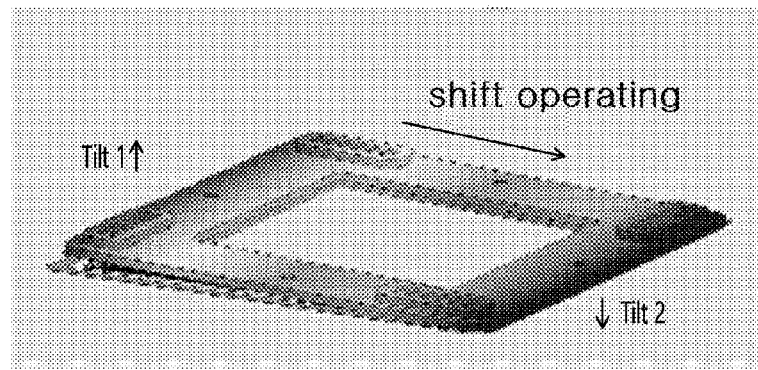
(a)
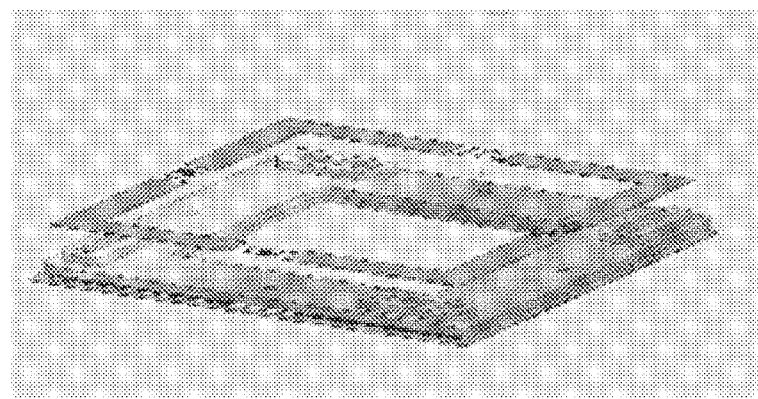
(b)

SUBSTRATE FOR IMAGE SENSOR

CROSS REFERENCE TO RELATED APPLICATIONS

This application is the National Phase of PCT International Application No. PCT/KR2020/013778, filed on Oct. 8, 2020, which claims priority under 35 U.S.C. 119 (a) to Patent Application No. 10-2019-0126183, filed in the Republic of Korea on Oct. 11, 2019, all of which are hereby expressly incorporated by reference into the present application.

TECHNICAL FIELD

An embodiment relates to a substrate, and more particularly, to a substrate for an image sensor capable of relative movement with respect to a lens barrel.

BACKGROUND ART

In general, a camera device is mounted on an automobile, an endoscope, and an electronic device such as a CCTV, in addition to a portable device such as a mobile communication terminal and an MP3 player. Such a camera device has been gradually developed with a focus on high pixels, and has been reduced in size and thickness. Not only that, current camera devices are changing so that a variety of additional functions can be realized at low production costs.

The above-described camera device includes a lens barrel for accommodating a lens, a lens holder coupled with the lens barrel, an image sensor disposed in the lens holder, and a driving substrate on which the image sensor is mounted. In this case, the lens transmits an image signal of a subject to the image sensor. Then, the image sensor converts the video signal into an electric signal.

Here, accuracy of the video signal at the camera device is determined according to a focal length defined as a distance between the lens and the image sensor.

Accordingly, the camera device provided focus correction or shake compensation by moving the lens barrel relative to the image sensor. That is, in the camera device, the lens barrel accommodating the lens was moved relative to the image sensor in an X-axis, a Y-axis, and a Z-axis. At this time, the camera device required at least six elastic members such as springs to relatively move the lens barrel. In addition, each elastic member was coupled with the lens barrel by a method like bonding.

However, the camera device according to the related art as described above is composed of an upper spring plate disposed above the lens barrel, a lower spring plate disposed below the lens barrel, and a structure such as an elastic wire for fixing the Z-axis due to relative movement of the lens barrel, and thus there is a problem that the module structure of the camera device is complicated.

In addition, the camera device according to the related art requires a plurality of elastic members for moving the lens barrel, and thus there is a problem that the number of assembly processes for the plurality of elastic members increases.

DISCLOSURE

Technical Problem

An embodiment provides a substrate, a sensor driving device, and a camera module including the same having a new structure.

In addition, the embodiment provides a substrate, a sensor driving device, and a camera module including the same that allows the image sensor to move relative to the lens barrel.

In addition, the embodiment provides a substrate, a sensor driving device, and a camera module including the same capable of not only movement of the X-axis, Y-axis and Z-axis, but also tilt correction.

In addition, the embodiment provides a substrate' a sensor driving device and a camera module including the same that can simplify a spring structure for providing an autofocus function and a handshake correction function.

In addition, the embodiment provides a substrate, a sensor driving device, and a camera module including the same capable of suppressing the tilt occurring when the image sensor moves by adding a wire spring to a leaf spring structure serving as an electrical connection with the image sensor.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A substrate according to an embodiment includes an insulating layer; a first pattern portion disposed on the insulating layer; and a second pattern portion disposed on the insulating layer and spaced apart from the first pattern portion, wherein the insulating layer includes a first insulating portion including a first open region; and a second insulating portion disposed to surround an outside of the first insulating part and spaced apart from the first insulating portion with a second open region therebetween; wherein the first pattern portion includes a first lead pattern portion disposed on the first insulating portion; a second lead pattern portion disposed on the second insulating portion; and a connection pattern portion having one end connected to the first lead pattern portion and the other end connected to the second lead pattern portion, and disposed on the second open region; wherein the connection pattern portion includes a bent portion positioned on a corner of the second open region.

In addition, the first pattern portion is a signal transmission pattern, and the second pattern portion is a reinforcing pattern physically separated from the first pattern portion.

In addition, the first lead pattern portion is disposed on the first insulating portion in a first direction, and the second lead pattern portion is disposed on the second insulating portion in a second direction orthogonal to the first direction.

In addition, a length of the connection pattern portion is greater than a linear distance between the first lead pattern portion and the second lead pattern portion.

In addition, a length of the connection pattern portion is greater than a width of the second open region.

In addition, the length of the connection pattern portion has a range of 1.5 to 20 times a linear distance between an outer side of the first insulating part and an inner side of the second insulating portion.

In addition, the connection pattern portion is disposed to float on the second open region.

In addition, the first lead pattern portion includes a first-first lead pattern part disposed on the first insulating portion; and a first-second lead pattern part extending inwardly from the first part and disposed on the first open region.

In addition, the second lead pattern portion includes a second-first lead pattern part disposed on the second insulating portion; and a second-second lead pattern part extending outwardly from the second-first lead pattern part and not in contact with the second insulating portion.

In addition, a line width of the connection pattern portion is smaller than a line width of the first lead pattern portion or the second lead pattern portion.

In addition, the connection pattern portion includes one end connected to the first lead pattern portion and the other end connected to the second lead pattern portion, and a side surface of each of the one end and the other end has a curved surface.

In addition, a curvature (R) of the side surface of each of the one end and the other end has a range between 30 to 100.

In addition, the second pattern portion includes a first reinforcing pattern disposed on the first insulating portion and spaced apart from the first lead pattern portion; a second reinforcing pattern disposed on the second insulating portion and spaced apart from the second lead pattern portion, and a third reinforcing pattern disposed on the second open region to connect between the first reinforcing pattern and the second reinforcing pattern and spaced apart from the connection pattern portion.

In addition, the second reinforcement pattern includes a second-first reinforcing pattern part disposed on the second insulating portion and a second-second reinforcing pattern part extending from the first part and disposed outside the second insulation portion and not in contact with the second insulation portion.

In addition, the second-second reinforcing pattern part includes at least one coupling hole.

In addition, the insulating layer includes a third insulating portion disposed on the second open region and in contact with the connection pattern portion.

In addition, the third insulating portion is disposed on the corner of the second open region to contact the bent portion of the connection pattern portion.

In addition, the third insulating portion is physically separated from the first insulating portion and the second insulating portion.

In addition, a sensor driving device according to the embodiment includes a holder portion including a holder, a magnet portion coupled to the holder and a damping plate disposed on the holder; a fixed portion including a first substrate including a first terminal portion; a coil moving substrate including a coil portion spaced apart from the fixed portion and facing the magnet portion, and a sensor; a fourth substrate including a moving portion connected to the coil moving substrate and a fixed portion connected to the first substrate, and moving the sensor by electromagnetic force generated by the magnet portion and the coil portion; and a wire having one end connected to the damping plate of the fixing portion and the other end connected to the coil moving substrate, and elastically supporting the coil moving substrate.

In addition, the fourth substrate includes an insulating layer and a first pattern portion disposed on the insulating layer, wherein the insulating layer may include a first insulating portion including a first open region and a second insulating portion disposed to surround an outside of the first insulating portion and spaced apart from the first insulating portion with a second open region therebetween; wherein the first pattern portion includes a first lead pattern portion disposed on the first insulating portion, a second lead pattern portion disposed on the second insulating portion, and a connection pattern portion having one end connected to the first lead pattern portion and the other end connected to the second lead pattern portion and disposed on the second open region, wherein the connection pattern portion includes a bent portion positioned on a corner of the second open region.

In addition, the first lead pattern portion includes a first-first lead pattern part disposed on the first insulating portion, and a first-second lead pattern part extending inwardly from the first part and disposed on the first open region and connected to a second terminal portion of the coil moving substrate, and wherein the second lead pattern portion includes a second-first lead pattern part disposed on the second insulating portion, and a second-second lead pattern part extending outwardly from the second-first lead pattern part, not in contact with the second insulating portion, and connected to the first terminal portion of the first substrate.

In addition, the sensor driving device further includes a sensor substrate on which the sensor is disposed, and the coil moving substrate includes an opening in which the sensor substrate is disposed.

In addition, each of the holder and the coil moving substrate includes and a through hole aligned in an optical axis direction and through which the wire passes.

Effects of the Invention

In an embodiment, a connection pattern portion of a fourth substrate electrically connecting an image sensor portion and a first substrate is floated and disposed on an insulating layer while having a spring structure. In this case, the connection pattern portion serves as a circuit for transmitting a signal between the image sensor portion and the first substrate and serves as a spring for moving the image sensor included in the image sensor portion based on the X-axis, Y-axis, and Z-axis. Accordingly, the camera module according to the embodiment can remove a structure such as a spring plate required to move the image sensor, and the manufacturing process may be facilitated by excluding the process related to the spring plate.

In addition, when the connection pattern portion having a spring function is disposed, the connection pattern portion does not connect between a first lead pattern portion and a second lead pattern portion disposed in a region opposite to the region where the first lead pattern portion is disposed, but connects between the second lead pattern portion disposed in a region intersecting the region where the first lead pattern portion is disposed. For this reason, the connection pattern portion of the embodiment has a form in which it rotates in a tilting direction of the image sensor and is disposed. Accordingly, the tilt operation of the image sensor in the embodiment can be stably performed using the connection pattern portion.

In addition, the fourth substrate in the embodiment includes an insulating layer and a connection pattern portion disposed on the insulating layer, and the insulating layer includes a third insulating portion disposed in at least a portion of a region that vertically overlaps with the connection pattern portion. Accordingly, the camera module may move the image sensor with respect to the lens barrel while elastically supporting the image sensor more stably.

In addition, the length of the connection pattern portion in the embodiment is to have between at least 1.5 to 20 times a linear distance between the first lead pattern portion and the second lead pattern portion facing each other. Accordingly, it is possible to minimize noise generation while improving the mobility of the image sensor substrate.

In addition, the second actuator in the embodiment includes a connection wire that can solve the tilt problem. The connection wire serves as a support, not as an electrical connection, in the second actuator, and a tilt phenomenon of the image sensor portion in the Z-axis that may occur when the second actuator is driven is suppressed. Accordingly, the connection wire is additionally disposed together with the connection pattern portion of the fourth substrate, thereby suppressing the tilt phenomenon occurring when the image sensor part moves, and thereby improving operational reliability.

DESCRIPTION OF DRAWINGS

FIG. 1 is a view showing a camera module according to a comparative example.

FIG. 2 is a perspective view of a camera device according to a present embodiment.

FIG. 3 is a cross-sectional view taken along line A-A' of FIG. 2.

FIG. 4 is an exploded perspective view of the camera device according to the present embodiment.

FIG. 5 is an exploded perspective view of a second actuator according to an embodiment.

FIG. 6 is an exploded perspective view of a holder shown in FIG. 5.

FIG. 7 is a view showing a damping plate shown in FIG. 6.

FIG. 8 is a perspective view of a first substrate shown in FIG. 5.

FIG. 9 is an exploded perspective view of a coil moving substrate portion shown in FIG. 5.

FIG. 10 is a bottom view of a second substrate of the coil moving substrate portion shown in FIG. 9.

FIG. 11 (a) is a plan view of a third substrate of the coil moving substrate portion shown in FIG. 9.

FIG. 11 (b) is a bottom view of the third substrate of the coil moving substrate portion shown in FIG. 9.

FIG. 12 is a coupling view of a second substrate and a third substrate according to an embodiment.

FIG. 13 is an exploded perspective view of a fourth substrate shown in FIG. 5.

FIG. 14a is a plan view of the fourth substrate shown in FIG. 5.

FIG. 14b is a bottom view of the fourth substrate shown in FIG. 5.

FIG. 14C is an enlarged view of a partial region of the fourth substrate.

FIG. 15 is an exploded perspective view of an image sensor module 400 according to an embodiment.

FIG. 16a is a view for explaining x-axis direction shift driving through some configurations of the camera device according to the present embodiment.

FIG. 16b is a view for explaining y-axis direction shift driving through some configurations of the camera device according to the present embodiment.

FIG. 16c is a view for explaining z-axis rotational driving through some configurations of the camera device according to the present embodiment.

FIG. 17 is a view showing a magnetic flow and a Lorentz force between a magnet and a coil of the camera device according to the present embodiment.

FIG. 18 (a) is a view showing the reliability evaluation result of the camera module according to the comparative example, and FIG. 18 (b) is a view showing the reliability evaluation result of the camera module according to the embodiment.

BEST MODE

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (A), and (b) may be used.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

Hereinafter, an embodiment of the present disclosure will be described in detail with reference to the accompanying drawings.

FIG. 1 is a view showing a camera module according to Comparative Example.

A camera module having an optical image stabilizer (OIS) function and an Auto Focusing (AF) function requires at least two spring plates.

The camera module according to the comparative example may have two spring plates. The camera module according to the comparative example requires an elastic member such as at least six springs for the spring plate.

Referring to FIG. 1, the camera module according to the comparative example includes an optical system including a lens assembly, an infrared cut-off filter, and a sensor unit. That is, the camera module according to the comparative example includes a lens barrel 10, a lens assembly 20, a first elastic member 31, a second elastic member 32, a first housing 41, a housing 42, an infrared cut-off filter 50, a sensor unit 60, a circuit board 80, and drivers 71, 72, 73, and 74.

In this case, the lens barrel 10 is connected to the first housing 41. That is, the lens barrel 10 is connected to the first housing 41 via the first elastic member 31. That is, the lens barrel 10 is connected to the first housing 41 so as to be movable by the first elastic member 31. In this case, the first elastic member 31 includes a plurality of springs (not shown). For example, the first elastic member 31 connects between the lens barrel 10 and the first housing 41 at a plurality of points of the lens barrel 10.

The second elastic member 32 is connected to the first housing 41 and the second housing 42 accommodating the first housing 41. The second elastic member 32 fixes the first housing 41 to the second housing 42 so as to be movable. The second elastic member 32 includes a plurality of springs. In detail, the second elastic member 32 includes a plate-shaped spring.

In this case, the first elastic member 31 moves the lens barrel 10 relative to the sensor unit 60 in a vertical direction (a Z-axis direction) while supporting the lens barrel 10. To this end, the first elastic member 31 includes at least four springs.

In addition, the second elastic member 32 moves the lens barrel 10 relative to the sensor unit 60 in a horizontal direction (an X-axis direction and a Y-axis direction) while supporting the lens barrel 10. To this end, the second elastic member 32 includes at least two springs.

As described above, in the camera module according to the comparative example, OIS and AF are performed as the lens barrel 10 moves in X-axis, Y-axis, and Z-axis directions. To this end, the camera module according to the comparative example requires at least six elastic members such as springs. In addition, the camera module according to the comparative example requires two spring plates for supporting the elastic member as described above. Further, the camera module according to the comparative example requires an additional member such as an elastic wire for fixing the Z-axis of the lens barrel 10. Therefore, the camera module according to the comparative example has a complicated spring structure for moving the lens barrel in the X-axis, Y-axis and Z-axis directions.

In addition, in the camera module according to the comparative example, it is necessary to manually perform an operation of bonding the respective elastic members in order to couple the elastic member with the lens barrel 10. Accordingly, the camera module according to the comparative example has a complicated manufacturing process and requires a long manufacturing time.

In addition, the camera module according to the comparative example provides a tilt function of the lens barrel 10, but has a structure in which tilt correction of an image is substantially difficult. That is, even though the lens barrel 10 rotates with respect to the sensor unit 60, an image incident on the sensor unit 60 does not change, and thus the tilt correction of the image is difficult, and further, the tilt function itself is unnecessary.

Hereinafter, a substrate for an image sensor, a camera module, and a camera device including the same according to an embodiment will be described.

"Optical axis direction" used below is defined as an optical axis direction of a lens and/or an image sensor coupled to a lens driving device.

"Vertical direction" used below may be a direction parallel to the optical axis direction. The vertical direction may correspond to "z-axis direction". "Horizontal direction" used below may be a direction perpendicular to the vertical direction. That is, the horizontal direction may be a direction perpendicular to the optical axis. Therefore, the horizontal direction may include "x-axis direction" and "y-axis direction".

"Auto focus function" used below is defined as a function for automatically adjusting a focus on a subject by adjusting a distance from an image sensor and moving a lens in the optical axis direction according to the distance of the subject so that a clear image of the subject may be obtained on the image sensor. Meanwhile, "auto focus" may correspond to "AF (Auto Focus)".

"Camera shake correction function" used below is defined as a function of moving the lens and/or the image sensor so as to cancel vibration (movement) generated in the image sensor by external force. Meanwhile, "Camera shake correction function" may correspond to "Optical Image Stabilization (OIS)".

FIG. 2 is a perspective view of a camera device according to a present embodiment, FIG. 3 is a cross-sectional view taken along line A-A' of FIG. 2, and FIG. 4 is an exploded perspective view of the camera device according to the present embodiment.

The camera device in the embodiment may include a camera module. The camera device may include a lens driving device. Here, the lens driving device may be a voice coil motor (VCM). The lens driving device may be a lens driving motor. The lens driving device may be a lens driving actuator. The lens driving device may be a first actuator. The camera device may include a sensor driving device. Here, the sensor driving device may be a voice coil motor. The sensor driving device may be a sensor driving motor. The sensor driving device may be a sensor driving actuator. The sensor driving device may be a second actuator.

Here, the lens driving device may include an AF module.

In addition, the sensor driving device may include an OIS module.

<Camera Device>

A camera device may include a lens module 100.

The lens module 100 may include a lens and a lens barrel. The lens module 100 may include a lens and a lens barrel. The lens module 100 may include one or more lenses and a lens barrel capable of accommodating one or more lenses. However, one configuration of the lens module 100 is not limited to the lens barrel, and any holder structure capable of supporting one or more lenses may be used. The lens module 100 is coupled to the first actuator 200 to move. The lens module 100 may be coupled to an inner side of the first actuator 200 as an example. Accordingly, the lens module 100 may move the inner side the first actuator 200 in response to the movement of the first actuator 200. The lens module 100 may be screw-coupled to the first actuator 200. As an example, the lens module 100 may be coupled to the first actuator 200 by an adhesive (not shown). Meanwhile, a light passing through the lens module 100 may be irradiated to an image sensor. Meanwhile, the lens module 100 may include, for example, five lenses. The lens module 100 may include a liquid lens and a solid lens. The liquid lens includes a conductive liquid and a non-conductive liquid, and the interface between the conductive liquid and the non-conductive liquid can be controlled by electrical force. The liquid lens may be a lens whose focal length is adjusted by adjusting the interface.

The camera device may include an actuator.

In detail, the camera device may include a first actuator 200 for shifting the lens module 100. The first actuator 200 may be an AF module. The first actuator 200 may move the lens module 100 in a vertical direction (obviously, an optical axis direction). That is, the first actuator 200 may perform an auto focus function by moving the lens module 100 in the optical axis direction.

A second actuator 600 may drive an image sensor 430. The second actuator 600 may tilt or rotate the image sensor 430. The second actuator 600 may move the image sensor 430. The second actuator 600 may move the image sensor 430 in a first direction perpendicular to an optical axis, move the image sensor 430 in a second direction perpendicular to the optical axis and the first direction, and rotate the image sensor 430 based on the optical axis. In this case, the first direction may be an x-axis direction, the second direction may be a y-axis direction, and the optical axis may be a z-axis direction.

Meanwhile, the first actuator 200 and the second actuator 600 may include a driver to move the lens module 100 and the image sensor 430, respectively. That is, the first actuator 200 may include a first driver (described later). In addition, the second actuator 600 may include a second driver (described later). Each of the first and second drivers may include a coil and a magnet. In addition, the coil and the magnet may generate an electromagnetic force therebetween to drive the lens module 100 and the image sensor 430, respectively.

The camera device may include case. The case may include a first case 300 and a second case 500. The first case 300 may be an upper case covering an upper region of the camera device. In this case, the first case 300 may be a shield can.

The first case 300 may include a first opening 310 and a second opening 320.

The second opening 320 may be an exposure hole that exposes a part of the configuration of the first actuator 200 received in the first case 300 to the outside.

Meanwhile, recently, as the camera technology has been developed, an image resolution has been increased, thereby increasing a size of the image sensor 440. At this time, as the size of the image sensor 440 increases, a size of the lens module 100 and parts of the actuator for shifting the lens module 100 are also increase. Accordingly, as a weight of the other actuator components for shifting the lens module 100 as well as the weight of the lens module 100 increases, it is difficult to stably shift the lens module 100 using the conventional VCM technology, and a lot of problems occur in terms of reliability.

Accordingly, in the present embodiment, AF is performed using the first actuator 200 implementing a lens shift method, and OIS is executed using the second actuator 600 implementing the image sensor shift method, thereby, the reliability of the camera device is improved.

Furthermore, there is a 5-axis camera shake in the camera shake of the camera device. For example, in the 5-axis camera shake, there are two camera shakes that are shaken at an angle, two camera shakes that is shaken by a shift, and one camera shake that are shaken by rotation. At this time, only the 4-axis camera shake correction is possible with the lens shift method, and the camera shake that are shaken in rotation cannot be corrected. This is because the camera shake caused by rotation should be corrected by rotation of the optical module, and even when the lens module 100 is rotated, an incident optical path is maintained as it is, and accordingly, the 5-axis camera shake correction is not possible with the lens shift method. Therefore, in the present embodiment, it is possible to solve a reliability problem of the lens shift method according to the development of the camera technology as described above, while applying the sensor shift method so as to enable the 5-axis camera shake correction.

Hereinafter, each configuration of the camera device according to the embodiment will be described in more detail. A characteristic of the camera device of the embodiment is the second actuator, and accordingly, the second actuator will be described in detail below.

<Second Actuator>

Hereinafter, the second actuator 600 will be described.

The second actuator 600 may be positioned below the first actuator 200 and may operate independently of the first actuator 200 to shift the image sensor module 400.

To this end, the second actuator 600 may include a fixed portion having a fixed position and a moving portion whose position is moved by an electromagnetic force of a second driving portion in a state coupled to the fixed position. The fixed portion means a component whose position is not changed and is fixed among components constituting the second actuator 600 when the second actuator 600 is driven, and the moving portion means a component whose position changes when the second actuator 600 is driven.

FIG. 5 is an exploded perspective view of a second actuator according to an embodiment, FIG. 6 is an exploded perspective view of a holder shown in FIG. 5, FIG. 7 is a view showing a damping plate shown in FIG. 6, FIG. 8 is a perspective view of a first substrate shown in FIG. 5, FIG. 9 is an exploded perspective view of a coil moving substrate portion shown in FIG. 5, FIG. 10 is a bottom view of a second substrate of the coil moving substrate portion shown in FIG. 9, FIG. 11 (*a*) is a plan view of a third substrate of the coil moving substrate portion shown in FIG. 9, FIG. 11 (*b*) is a bottom view of the third substrate of the coil moving substrate portion shown in FIG. 9, FIG. 12 is a coupling view of a second substrate and a third substrate according to an embodiment, FIG. 13 is an exploded perspective view of a fourth substrate shown in FIG. 5, FIG. 14*a* is a plan view of the fourth substrate shown in FIG. 5, FIG. 14*b* is a bottom view of the fourth substrate shown in FIG. 5, and FIG. 14C is an enlarged view of a partial region of the fourth substrate.

Referring to FIGS. 5 to 14C, the second actuator 600 includes a fixed portion and a moving portion. In this case, the fixed portion of the second actuator 600 may include a housing 610, a holder portion 620, and a portion of the substrate portion 630, 640, and 650. In addition, the moving portion of the second actuator 600 may include the remaining portion of the substrate portion 630, 640, and 650. The substrate portion 630, 640, and 650 include a coil moving substrate portion 640 including a first substrate 630, a second substrate 641, and a third substrate 642, and a fourth substrate 650.

In addition, the first substrate 630 of the substrate portion 630, 640, and 650 may be a fixed portion of the second actuator 600. In addition, the coil moving substrate portion 640 including the second substrate 641 and the third substrate 642 of the substrate portion 630, 640, and 650 may be a moving portion of the second actuator 600. In addition, the fourth substrate 650 may be a fixed portion, or, alternatively, may be a moving portion. That is, a part of the fourth substrate 650 may be a fixed portion, and the remaining part of the fourth substrate 650 may be a moving portion. Preferably, an outer frame (described later) of the fourth substrate 650 may be connected to the first substrate 630 to function as a fixed portion, and an inner frame of the fourth substrate 650 may be connected to the coil moving substrate portion 640 including the second substrate 641 and the third substrate 642 to function as a moving portion. This will be described in more detail below.

Also, the second actuator 600 may include a housing 610. The housing 610 may have an accommodating space for accommodating components constituting the second actuator 600 therein. Preferably, the housing 610 may accommodate a portion of the first substrate 630, the second substrate 641, the holder portion 620, the third substrate 642, and the fourth substrate 650.

The second actuator 600 as described above will be described in detail as follows.

—Housing—

The housing 610 may include a bottom portion 611 having a first opening 612 formed in a center thereof, and a sidewall portion 613 protruding upward from an edge region of the bottom portion 611. At least a portion of the sidewall portion 613 of the housing 610 may include an exposed portion 616. In addition, the exposed portion 616 allows a portion of the first substrate 630 accommodated in the housing 610 to be exposed to the outside of the housing 610. The housing 610 may include a plurality of first guide protrusions 614 formed in a region adjacent to an inner side of the bottom portion 611. The housing 610 may include a coupling groove 615 recessed in the downward direction on an upper surface of the sidewall portion 613.

—Holder Portion—

A holder portion 620 is disposed on the housing 610.

The holder portion 620 may include a holder 621, a damping plate 622, and a magnet portion 623.

The holder 621 may be a magnet holder in which the magnet portion 623 is disposed.

Also, the holder 621 may be a damping plate holder on which the damping plate 622 is disposed.

The holder 621 may include a first frame 621a having a second opening 621-1 formed in the center and disposed on the housing 610, and a second frame 621b extending downwardly from a lower end of the first frame 621a.

The first frame 621a of the holder 621 may be disposed to partially cover an open upper region of the housing 610. The first frame 621a may have a plate shape in which the second opening 621-1 is formed in the center. The second opening 621-1 may be aligned with the first opening 612 on the optical axis.

The second frame 621b may be disposed on a lower surface of the first frame 621a in a region corresponding to the exposed portion 616 of the housing 610. The second frame 621b may extend downward from the first frame 621a and may be disposed in the exposed portion 616 of the housing 610. Preferably, the second frame 621b may cover a portion of an opening the exposed portion 616 of the housing 610. That is, a region 621-5 corresponding to a second part of the exposed portion 616 in the second frame 621b may be opened.

That is, an area of the second frame 621b may be smaller than an area of the exposed portion 616. Accordingly, the second frame 621b may be disposed to cover only the first part of the exposed portion 616. In addition, the second part of the exposed portion 616 excluding the first part may maintain an open state in the state in which the holder 621 is disposed on the housing 610. The region 621-5 of the second frame 621b and the second part of the exposed portion 616 may be aligned with the second open region 320 of the first case 300 in a direction perpendicular to the optical axis. Accordingly, the second part of the exposed portion 616 may expose a terminal 262 of the flexible circuit board 260 of the first actuator 200 together with the second open region 320 of the first case 300.

A first seating portion 621-2 may be provided on the first frame 621a of the holder 621. The first seating portion 621-2 may be a step disposed on an inner upper surface of the first frame 621a.

A first recess 621-3 in which the elastic portions 622-2 and 622-3 of the damping plate 622 are disposed is formed in the first seating portion 621-2 of the holder 621. A plurality of the first recesses 621-3 may be formed to be spaced apart from each other by a predetermined interval on the first seating portion 621-2.

Also, a first through hole 621-4 into which a connection wire 624 is inserted may be formed in the first recess 621-3.

A damping plate 622 may be disposed on the first seating portion 621-2 of the holder 621. The damping plate 622 includes a plate portion 622-1 disposed on the first seating portion 621-2, and elastic parts 622-2 and 622-3 extending from the plat portion 622-1 and disposed on the first recess 621-3.

The elastic portions 622-2 and 622-3 may be integrally formed with the plate portion 622-1. However, the elastic portions 622-2 and 622-3 may extend from the plate portion 622-1 and include a bent region bent at least once.

Preferably, the elastic portions 622-2 and 622-3 extend from a first elastic portion 622-2 including a bent region that is bent at least once, and a second elastic portion 622-3 extending from the first elastic portion 622-2 and having a hole formed in a region corresponding to the first through hole 621-4. That is, the hole formed in the second elastic portion 622-3 and the first through hole 621-4 of the holder 621 may be holes through which the connection wire 624 passes.

In addition, one end of the connection wire 624 may be coupled to the second elastic portion 622-3 of the damping plate 622 by soldering.

As described above, the elastic portions 622-2 and 622-3 of the damping plate 622 may include bent portions, and may preferably be formed by bending a plurality of portions. Accordingly, the elastic portions 622-2 and 622-3 of the damping plate 622 may have elasticity.

At this time, when the elastic portions 622-2 and 622-3 of the damping plate 622 do not include bent portions, the connection wire 624 may move together when the image sensor module 400 is moved to cause warpage, and breakage may occur depending on the degree of occurrence of the warpage. Alternatively, the elastic portions 622-2 and 622-3 of the damping plate 622 of the embodiment include bent portions, thereby, it can serve as a suspense when the image sensor module 400 moves, and accordingly, it is possible to increase the rigidity of the connection wire 624 by imparting elasticity to the connection wire 624.

One end of the connection wire 624 as described above is coupled to the elastic portions 622-2 and 622-3 of the damping plate 622. In addition, the connection wire 624 may pass through the first through hole 621-4 of the holder 621 to extend in a downward direction of the holder 621, preferably a direction in which a bottom portion 611 of the housing 610 is located).

The connection wire 624 may have one end connected to the damping plate 622 and the other end connected to the coil moving substrate portion 640. In this case, the damping plate 622 is a fixed portion of the second actuator 600, and the coil moving substrate portion 640 is a moving portion of the second actuator 600. In this case, when the image sensor module 400 shifts according to the shift of the coil moving substrate portion 640 in a state in which the connection wire 624 does not exist, a tilt of the image sensor module 400 may occur due to elasticity of the coil moving substrate portion 640 or the fourth substrate 650 regardless of the direction in which the shift occurs.

Accordingly, the connection wire 624 may be connected to the damping plate 622, and the other end may be connected to the coil moving substrate portion 640 to support the coil moving substrate portion 640. Preferably, the connection wire 624 may suppress a tilt phenomenon that occurs when the coil moving substrate portion 640, further the fourth substrate 650, and further the image sensor module 400 is shifted. Here, the tilt phenomenon may include a phenomenon in which the image sensor module 400 sags downward due to elasticity of the fourth substrate 650. In addition, the connection wire 624 may prevent the coil moving substrate portion 640 from sagging in the downward direction. That is, the coil moving substrate portion 640 may be shifted while being suspended from the holder portion 620 through the connection wire 624, thereby minimizing a tilt phenomenon.

The connection wire 624 may have elasticity. The connection wire 624 may be an elastic member. The connection wire 624 may be a wire spring. As described above, the connection wire 624 may connect the damping plate 622 to the third substrate 642 of the coil moving substrate portion 640 in a state in which the holder portion 620 and the coil moving substrate portion 640 are spaced apart by a predetermined distance. The connection wire 624 may be formed of metal. The connection wire 624 may elastically support the movement of the coil moving substrate portion 640.

The connection wire 624 may include a plurality of wires. The connection wire 624 may be evenly distributed on the four side surfaces. That is, the connection wire 624 may form a mutually symmetrical structure with the sides facing each of the four sides. In this case, the connection wire 624 should elastically support the coil moving substrate portion 640. Here, when the connection wire 624 is disposed to have an asymmetric structure and the coil moving substrate portion 640 shifts, a difference occurs in the amount of movement or tilt in a portion with a relatively large number of connection wires and a portion other than this, and thus, a problem in operation reliability may occur. Accordingly, the connection wire 624 in the embodiment is uniformly disposed in each region to improve the reliability of the image sensor shift operation. On the other hand, although it is illustrated that there are 4 connection wires 624 in the drawing, this is only an embodiment, and has the above-described symmetrical structure and may be increased to 8 or 12.

Meanwhile, a magnet seating portion (not shown) in which a magnet portion 623 is disposed may be formed on a lower surface of the first frame 621a of the holder 621. The magnet portion 623 may be disposed on the magnet seating portion of the holder 621.

The magnet portion 623 may be disposed to face a coil portion (described later) disposed on the coil moving substrate portion 640. In this case, when a current is applied to the coil portion, an electric field may be formed around the coil portion. When a current is applied to the coil portion, the coil portion may move relative to the magnet portion 623 through electromagnetic interaction between the coil portion and the magnet portion 623.

The magnet portion 623 may be disposed on a corner of a lower surface of the holder 621. That is, the magnet portion 623 may be disposed on four corners of the lower surface of the holder 621. In addition, the magnet portion 623 may face the coil portion of the coil moving substrate portion 640. The magnet portion 623 may be a flat magnet having a flat plate shape.

The magnet portion 623 may include a plurality of magnets. The magnet portion 623 may include four magnets. The magnet portion 623 may include first to fourth magnets 623-1, 623-2, 623-3, and 623-4.

The first magnet 623-1 may face the first coil 641-2a disposed on the second substrate 641 of the coil moving substrate portion 640. The first magnet 623-1 may be disposed on a first corner formed on an upper left side of the holder 621. The second magnet 623-2 may face the second coil 641-2b disposed on the second substrate 641 of the coil moving substrate portion 640. The second magnet 623-2 may be disposed on a second corner formed on an right side of the holder 621. The third magnet 623-3 may face the third coil 641-2c disposed on the second substrate 641 of the coil moving substrate portion 640. The third magnet 623-3 may be disposed on a third corner formed on a lower right side of the holder 621. The fourth magnet 623-4 may face the fourth coil 641-2d disposed on the second substrate 641 of the coil moving substrate portion 640. The fourth magnet 623-4 may be disposed on a fourth corner formed on a lower left side of the holder 621. Each of the magnets constituting the magnet portion 623 may be disposed perpendicularly to an adjacent magnet, and may be disposed parallel to a magnet disposed in a diagonal direction.

—First Substrate—

The first substrate 630 may include a first region 631 having a third opening 631a formed in a center and a second region 632 extending from the first region 631 and in which a connector connected to an external device is disposed.

The first substrate 630 may include a first terminal portion 635 disposed in the first region 631. The first terminal portion 635 may be connected to a second lead pattern portion 652-2 of a fourth substrate 650 to be described later. For example, the second lead pattern portion 652-2 of the fourth substrate 650 is disposed on the first terminal portion 635 of the first substrate 630, and accordingly, the second lead pattern portion 652-2 and the first terminal portion 635 may be electrically connected to each other through a soldering process.

Preferably, the first terminal portion 635 may be disposed around the third opening 631a among the upper surfaces of the first region 631. The first terminal portion 635 may be referred to as a pad electrically connected to the second lead pattern portion 652-2 of the fourth substrate 650.

The first terminal portion 635 may include a plurality of terminals. The first terminal portion 635 may include a plurality of first terminals. For example, the first terminal portion 635 may include a plurality of first-first terminals 635-1 disposed on one side of the third opening 631a of the first region 631, and a plurality of first-second terminals 635-2 disposed on the other side opposite to one side of the third opening 631a of the first region 631.

The number of terminals of the first terminal portion 635 may be equal to or greater than the number of patterns of the second lead pattern portion 652-2. When the number of first terminals constituting the first terminal portion 635 is the same as the number of second lead patterns constituting the second lead pattern portion 652-2, all of the first terminals are the second leads patterns can be connected. In addition, when the number of first terminals constituting the first terminal portion 635 is greater than the number of second lead patterns constituting the second lead pattern portion 652-2, some of the first terminals may be connected to the second lead pattern. In addition, some of the remaining first terminals may function as test terminals for testing a connection state or the like.

A connector may be disposed on a second region 632 connected to the first region 631. The connector may be a port for electrically connecting to an external device.

The first region 631 may be disposed inside the camera device, and the second region 632 may extend from the first region 631 to be exposed to the outside of the camera device.

For example, the first region 631 is disposed inside the housing 610, and the second region 632 may be disposed outside the housing 610 through the exposed portion 616 of the housing 610, and the connector connected to an external device may be disposed on the externally disposed region.

The first substrate 630 may transmit a signal to the fourth substrate 650 or receive a signal transmitted from the fourth substrate 650. The first substrate 630 is electrically connected to the first pattern portion 652a of the fourth substrate 650, and thus transmits a power signal or a communication signal to the fourth substrate 650, and image information including an image signal obtained through the sensor module 400 may be received.

For example, the image sensor module 400 is coupled to the third substrate 642 of the coil moving substrate portion 640. In addition, the third substrate 642 is coupled to the second substrate 641 of the coil moving substrate portion 640. In addition, the first pattern portion 652a of the fourth substrate 650 is coupled to the third substrate 642. That is, the first lead pattern portion 652-1 of the first pattern portion 652a of the fourth substrate 650 is coupled to the third substrate 642. In addition, the first pattern portion 652a of the fourth substrate 650 is coupled to the first substrate 630. That is, the second lead pattern portion 652-2 of the first pattern portion 652a of the fourth substrate 650 is coupled to the first substrate 630.

Meanwhile, the image signal acquired through the image sensor module 400 is transmitted to the second substrate 641. At this time, the image signal may be provided to the third substrate 642 connected to the second substrate 641, this may be again provided from the third substrate 642 to the fourth substrate 650, and this may be again provided to the first substrate 630.

In addition, the power signal or communication signal transferred from the first substrate 630 to the second substrate 641 may be transferred to the second substrate 641 through the fourth substrate 650 and the third substrate 642.

The first substrate 630 may include a second terminal portion 636 disposed on an edge region of the first region 631. The second terminal portion 636 may be electrically connected to the flexible circuit board 260 included in the first actuator 200.

The first substrate 630 may be seated on the housing 610 by the first guide protrusion 614 of the housing 610. The first substrate 630 may be positioned in a fixed state on the housing 610. That is, the first substrate 630 may maintain a fixed position without moving when the second actuator 600 is driven.

Meanwhile, it has been described above that the first region 631 of the first substrate 630 is disposed in the housing 610. However, a portion of the first region 631 may be substantially disposed in the housing 610, and the remaining portion may be exposed to the outside of the housing 610 together with the second region 632. In addition, a gyro sensor 633 may be disposed on the exposed portion of the first region 631.

In addition, a passive device 634 may be disposed in the exposed portion of the first region 631.

That is, a gyro sensor 633 for implementing an anti-shake function is disposed on the first substrate 630 in the present exemplary embodiment. In addition, the first substrate 630 may feedback angular velocity/linear velocity detection information due to hand shake to the coil moving substrate portion 640 using information obtained through the gyro sensor 633.

—Coil Moving Substrate Portion—

The coil moving substrate portion 640 may be disposed under the holder portion 620 in the housing 610. The coil moving substrate portion 640 may be supported by the holder portion 620 through the connection wire 624 at a position spaced apart from the holder portion 620 by a predetermined interval.

That is, the connection wire 624 has one end coupled to the damping plate 622 constituting the holder portion 620, and the other end coupled to the coil moving substrate portion 640 disposed below the holder portion 620. The connection wire 624 may prevent the coil moving substrate portion 640 from being tilted in a direction other than the moving direction when the second actuator 600 is driven. That is, the connection wire 624 may prevent the coil moving substrate portion 640 from being tilted in the optical axis direction independent of the shift direction. That is, the coil moving substrate portion 640 may move relative to the holder portion 620 or the lens portion 100 by the interaction between the magnet portion 623 and the coil portion 641-2, in a state supported by the holder portion 620 through the connection wire 624.

To this end, the coil moving substrate portion 640 may include a second substrate 641, a third substrate 642, and a substrate holder 643. Here, the second substrate 641 and the third substrate 642 may be substrate portions constituting the coil moving substrate portion 640, and furthermore, it may be a moving portion that moves when the second actuator 600 is driven.

The second substrate 641 may be a main substrate. The second substrate 641 may be a driving substrate for driving the second actuator 600.

The second substrate 641 may include a fourth opening 641a. The fourth opening 641a may overlap the third opening 631a formed in the first substrate 630 in the optical axis direction.

The second substrate 641 may include coil portions 641-2 disposed on respective corners thereof.

The coil portion 641-2 may be electrically connected to circuit patterns (not shown) included in the second substrate 641. The coil portion 641-2 may be disposed to face the magnet portion 623 disposed on the holder portion 620. In addition, when a current is applied to the coil portion 641-2, an electric field may be formed around the coil portion 641-2.

The coil portion 641-2 may include four coils. In this case, current may be independently applied to at least three coils of the four coils. In the first embodiment, the coil portion 641-2 may be controlled by three channels. Alternatively, in the embodiment, the coil portion 641-2 may be controlled by four individual channels. The four coils constituting the coil portion 641-2 may be electrically separated from each other. Any one of the forward current and the reverse current may be selectively applied to each of the four coils of the coil portion 641-2. In the present embodiment, only three of the four coils may be electrically separated and one coil may be electrically connected to another coil. Alternatively, all four coils of the coil portion 641-2 may be electrically separated. When only three of the four coils are electrically separated, a total of six lead wires in three pairs may come out of the coil portion 641-2, and when all four coils are electrically separated, a total of eight lead wires in four pairs may come out of the coil portion 641-2.

When four coils are controlled by three channels as in the first embodiment of the present embodiment, a pair of the coil portion 641-2 and the magnet portion 623 should be driven in a z-axis-centered rotational drive, but when four coils are controlled by four channels as in the embodiment, the coil portion 641-2 and the magnet portion 623 may be driven in two pairs in the z-axis-centered rotational drive.

The coil portion 641-2 may include first to fourth coils 641-2a, 641-2b, 641-2c, 641-2d. In addition, each of the first to fourth coils 641-2a, 641-2b, 641-2c, 641-2d may be disposed to face each magnet of the magnet portion 623 disposed on the holder portion 620.

The first coil 641-2a may be disposed on a first corner of the second substrate 641. The second coil 641-2b may be disposed on a second corner of the second substrate 641. The third coil 641-2c may be disposed on a third corner of the second substrate 641. The fourth coil 641-2d may be disposed on a fourth corner of the second substrate 641. The first coil 641-2a and the third coil 641-2c may be disposed on a first diagonal direction of the second substrate 641, and the second coil 641-2b and the fourth coil 641-2d may be disposed on a second diagonal direction of the second substrate 641.

In the present embodiment, the first coil 641-2a and the third coil 641-2c may be disposed to be elongated in a first direction, and the second coil 641-2b and the fourth coil 641-2d may be disposed to be elongated in a second direction. In this case, the first direction and the second direction may be vertical. A long side of the first coil 641-2a and a long side of the third coil 641-2c may be disposed in parallel with each other. A long side of the second coil 641-2b and a long side of the fourth coil 641-2d may be disposed in parallel to each other. The long side of the first coil 641-2a and the long side of the second coil 641-2b may not be parallel to each other. In this case, the long side of the first coil 641-2a and the long side of the second coil 641-2b may be disposed such that the virtual extension lines thereof are orthogonal to each other. A disposition direction of the first coil 641-2a and a disposition direction of the second coil 641-2b may be orthogonal to each other In the present embodiment, a current may be independently applied to at least three coils among the first to fourth coils 916-1, 916-2, 916-3, and 916-4. The first to fourth coils 916-1, 916-2, 916-3, and 916-4 may be electrically separated from each other.

Meanwhile, hall sensors 917 may be disposed at inner sides of the first to fourth coils 641-2a, 641-2b, 641-2c and 641-2d. In this case, the hall sensors 641-3 may be disposed only at inner sides of three coils among the first to fourth coils 641-2a, 641-2b, 641-2c and 641-2d. This is because, in the first embodiment, since the first to fourth coils 641-2a, 641-2b, 641-2c and 641-2d are controlled by three channels, one coil may not necessarily have a hall sensor. The hall sensor 641-3 may sense a magnetic force of the magnet portion 623. A movement of the image sensor module may be identified in real time via a magnetic force of the magnet portion 623 sensed by the hall sensor 641-3. In addition, this may allow an optical image stabilization (OIS) feedback control.

The hall sensor 641-3 may be configured in plural. That is, as described above, the hall sensor 641-3 may include three sensors. A movement in the x-axis direction, a movement in the y-axis direction, and a rotation around the z-axis of the image sensor 440 may be sensed through the three sensors. The hall sensor 641-3 may include first to third sensors. The first sensor may face the first magnet, the second sensor may face the second magnet, and the third sensor may face the third magnet.

The hall sensor 641-3 may include a first hall sensor for sensing an x-axis movement amount and/or displacement of the magnet portion 623. The hall sensor 641-3 may include a second hall sensor for sensing a y-axis movement amount and/or displacement of the magnet portion 623. The hall sensor 641-3 may include a third hall sensor for sensing the x-axis movement amount and/or displacement or the y-axis movement amount and/or displacement of the magnet portion 623. A movement of the magnet portion 623 rotating around the z-axis may be sensed through at least two of the first hall sensor, the second hall sensor, and the third hall sensor.

A driver IC 641-4 for controlling an operation of the second actuator may be disposed on the second substrate 641. In addition, various passive devices 641-5 for operating the second actuator may be disposed on the second substrate 641.

In this case, the second substrate 641 should connect the coil portion 641-2, the driver IC 641-4, and the passive devices 641-5 to each other, and then to the first substrate 630. Here, a terminal may be in twelve required for the electrical connection from the second substrate 641 to the first substrate 630. The twelve terminals may be terminals connected to the driver IC 641-4. In this case, 4 of the 12 terminals may be connected to each other. Accordingly, the four terminals may be constituted by one terminal. Accordingly, when connecting between the first substrate 630 and the second substrate 641, there may be eight terminals required for connection with the driver IC 641-4.

In addition, the number of terminals required for electrical connection with the image sensor module 400 on the second substrate 641 may be 28. In addition, the second substrate 641 must transmit the image signal acquired through the image sensor module 400 to the first substrate 630. Accordingly, in the connection between the first substrate 630 and the second substrate 641, there may be 28 terminals required for transmission of the image signal.

The third terminal portion 641-8 is disposed on the lower surface of the second substrate 641 and is connected to the driver IC 641-4, or transfers the image signal acquired through the image sensor module 400 to the first substrate 630. The third terminal portion 641-8 may be a pad for electrical connection with the first substrate 630. Preferably, the first substrate 630 and the second substrate 641 do not directly exchange signals with each other, but exchange signals through the third substrate 642 disposed in a middle. Accordingly, the third terminal portion 641-8 may be a pad for electrical connection with the third substrate 642. Preferably, the third terminal portion 641-8 may be connected to the second substrate 641 to transfer a signal (eg, a control signal) generated from the first substrate 630 to the second substrate 641 or transfer a signal (eg, an image signal) generated from the second substrate 641 to the first substrate 630.

Meanwhile, the third terminal portion 641-8 may be disposed in a plurality of regions on the lower surface of the second substrate 641. For example, the third terminal portion 641-8 may include a third-first terminal part 641-8a disposed on a first side of the fourth opening 641a of the lower surface of the second substrate 641, and a third-second terminal part 641-8b disposed on a second side facing the first side.

In addition, a fourth terminal portion 641-7 to which the image sensor module 400 is coupled may be formed on a lower surface of the second substrate 641. The fourth terminal portion 641-7 may be disposed on a plurality of regions on the lower surface of the second substrate 641.

That is, the fourth terminal portion 641-7 may include a fourth-first terminal part 641-7*a* and a fourth-second terminal part 641-7*b* disposed in a region facing each other on a lower surface of the fourth opening 641*a* with the fourth opening 641*a* interposed therebetween. At this time, the fourth terminal portion 641-7 may be connected to the image sensor module 400 to receive an image signal transmitted through the image sensor module 400 or receive a signal other than the image signal.

In this case, when the terminal for receiving the image signal and the terminal for receiving other signals are disposed on the same region of the lower surface of the second substrate 641, the image signal may include a noise signal. Therefore, the fourth-first terminal part 641-7*a* to which the image signal is transmitted and the fourth-second terminal part 641-7*b* to which other signals are transmitted among the fourth terminal portion 641-7 connected to the image sensor module 400 are disposed in different region, and accordingly, the quality of the image signal can be improved.

Meanwhile, a second through hole 641-6 may be formed in the second substrate 641. In this case, the second through hole 641-6 may be aligned and arranged with the first through hole 621-4 formed in the holder 621 in the optical axis direction. The second through hole 641-6 may be a wire through hole through which the connection wire 624 coupled to the damping plate 622 passes.

A third substrate 642 may be disposed under the second substrate 641. The third substrate 642 may relay an electrical connection between the first substrate 630, the second substrate 641, and the fourth opening 641*a*.

In this case, a substrate holder 643 may be disposed between the second substrate 641 and the third substrate 642.

The substrate holder 643 may be disposed between the second substrate 641 and the third substrate 642 to increase the bonding force between the second substrate 641 and the third substrate 642.

A fifth opening 643-1 may be formed in a center of the substrate holder 643. The fifth opening 643-1 may be aligned with the fourth opening 641*a* formed in the second substrate 641 in the optical axis direction.

In addition, the substrate holder 643 may include a protrusion 643-2 extending outwardly on an edge region. The protrusion 643-2 may be formed to protrude outward from the side surface of the substrate holder 643. The protrusion 643-2 may be seated on an upper surface of the second substrate 641 so that a lower surface of the protrusion 643-2 is in contact with the upper surface of the second substrate 641. In this case, the protrusion 643-2 may be configured in plurality, so that the substrate holder 643 can be stably seated on the second substrate 641.

Meanwhile, the protrusion 643-2 formed on the substrate holder 643 may be disposed in a region overlapping the second through hole 641-6 formed in the second substrate 641 in the optical axis direction. Accordingly, the protrusion 643-2 may include a recess 643-3 that is recessed inwardly to expose the second through hole 641-6.

In addition, the third substrate 642 may be coupled to the substrate holder 643 under the second substrate 641. An opening may also be formed in a center of the third substrate 642, and the opening may be aligned with openings of the second substrate 641, the third substrate 642, the first actuator, etc. in the optical axis direction As shown in (a) of FIG. 11, the third substrate 642 may include a fifth terminal portion 642-2 formed on an upper surface of the third substrate 642.

The fifth terminal portion 642-2 may face the third terminal portion 641-8 formed on the lower surface of the second substrate 641. That is, the fifth terminal portion 642-2 may be arranged to be aligned with the third terminal portion 641-8 formed on the second substrate 641 in the optical axis direction. In addition, the fifth terminal portion 642-2 may include terminals corresponding to the number of terminals of the third terminal portion 641-8. The fifth terminal portion 642-2 and the third terminal portion 641-8 may be electrically connected to each other through soldering.

In this case, the fifth terminal portion 642-2 may include a fifth-first terminal part 642-2*a* connected to the third-first terminal part 641-8*a* of the third terminal portion 641-8, and a fifth-second terminal part 642-2*b* connected to the third-second 641-8*b*.

Also, as shown in (b) of FIG. 11, the third substrate 642 may include a sixth terminal portion 642-3 formed on a lower surface thereof. The sixth terminal portion 642-3 may be electrically connected to a first pattern portion 652*a* of a fourth substrate 650, which will be described later. More preferably, the sixth terminal portion 642-3 may be coupled to the first lead pattern portion 652-1 of the first pattern portion 652*a* of the fourth substrate 650. That is, the fourth substrate 650 is disposed under the sixth terminal portion 642-3, and further, is positioned under the first lead pattern portion 652 among the first pattern portion 652*a* of the fourth substrate 650. In addition, the sixth terminal portion 642-3 may be coupled and electrically connected to the first lead pattern portion 652-1 through soldering.

In this case, the fifth terminal portion 642-2 and the sixth terminal portion 642-3 may be aligned with each other in the optical axis direction. That is, some of the fifth terminal portion 642-2 and the sixth terminal portion 642-3 receive the image signal transmitted from the second substrate 641, and transfers the received image signal to the first substrate 630 through the fourth substrate 650. In this case, the longer the length of a signal line that transmits the image signal, the more it may affect the quality of the image signal, and accordingly, the fifth terminal portion 642-2 and the sixth terminal portion 642-3 may be aligned with each other in the optical axis direction in order to minimize the length of the signal line. And, one of the fifth terminal portion 642-2 and the sixth terminal portion 642-3 is a terminal for transmitting an image signal, the other is a terminal for transmitting signals other than the image signal. Accordingly, the fifth terminal portion 642-2 and the sixth terminal portion 642-3 in the embodiment are separated from each other with an opening therebetween, and thereby, the effect of noise generated in the process of transmitting the image signal is minimized.

Meanwhile, the third substrate 642 may include a plurality of coupling protrusions 642-1 protruding outward from an outer surface. In addition, the coupling protrusion 642-1 may include a third through-hole 642-4 penetrating in the optical axis direction.

The third through-hole 642-4 may be aligned with the first through hole 621-4 formed in the holder 621 and the second through-hole 641-6 formed in the second substrate 641 in the optical axis direction. In addition, a portion of the connection wire 624 passing through the first through hole 621-4 and the second through hole 641-6 may be disposed in the third through hole 642-4.

In this case, a coupling pad (not shown) may be disposed around the third through hole 642-4 on the lower surface of the coupling protrusion 642-1. The coupling pad (not shown) may be disposed around the third through hole 642-4 for soldering the connection wire 624. In addition, the other end of the connection wire 624 may be soldered to the coupling pad after passing through the third through hole 642-4.

Consequently, one end of the connection wire 624 is coupled to the damping plate 622, and the other end of the connection wire 624 is coupled to the third substrate 642. In addition, a portion between one end and the other end of the connection wire 624 may be located in the first through hole 621-4, the second through hole 641-6, and the third through hole 642-4. In this case, the length of the connection wire 624 may be greater than the sum of the thickness of the damping plate 622, the thickness of the holder 621, the thickness of the second substrate 641, and the thickness of the third substrate 642. Accordingly, the coil moving substrate portion 640 may be disposed in a state of being suspended from the holder portion 620 at a position spaced apart from the holder portion 620 by a predetermined distance through the connection wire 624.

—Fourth Substrate—

The fourth substrate 650 may be disposed between the first substrate 630 and the third substrate 642. At least a portion of the fourth substrate 650 may have elasticity. In addition, the coil moving substrate portion 640 disposed on the fourth substrate 650 may move relative to the lens portion by the elastic force of the fourth substrate 650 and the interaction between the magnet portion 623 and the coil portion 641-2. The fourth substrate 650 may also be expressed as an image sensor substrate on which an image sensor is disposed.

The fourth substrate 650 enables the shift of the image sensor module 400 and also enables signal transmission.

The fourth substrate 650 includes an insulating layer 651 and a pattern portion 652 disposed on one surface of the insulating layer 651. At this time, although the drawing shows that the pattern portion 652 is disposed on a lower surface of the insulating layer 651, the embodiment is not limited thereto, and the pattern portion 652 may be disposed on an upper surface of the insulating layer 651.

The insulating layer 651 may be divided into a plurality of regions separated from each other.

For example, the insulating layer 651 may include a first insulating portion 651-1 in which a first open region OR1 is formed in a center and a second insulating portion 651-2 disposed outside the first insulating portion 651-1 and spaced apart from the first insulating portion 651-1. In this case, although it is illustrated that the first insulating portion 651-1 and the second insulating portion 651-2 are separated from each other in the drawings, the embodiment is not limited thereto. A connection insulating portion (not shown) connecting an outer side of the first insulating portion 651-1 and an inner side of the second insulating portion 651-2 may be further disposed between the first insulating portion 651-1 and the second insulating portion 651-2. In other words, the insulating layer 651 may have a structure in which the first insulating portion 651-1 and the second insulating portion 651-2 are physically completely separated with an open region interposed therebetween, alternatively may be connected to each other in some regions through a connection insulating portion additionally disposed in the open region. This allows a part of the insulating portion to remain without completely removing the region between the first insulating portion 651-1 and the second insulating portion 651-2, and the remaining insulating portion may function as a connection insulating portion connecting between the first insulating portion 651-1 and the second insulating portion 651-2. The connection insulating portion may provide an elastic force in the shift operation of the image sensor module 400, and furthermore, it is possible to prevent detachment between the first insulating portion 651-1 and the second insulating portion 651-2 during the shifting operating. The insulating layer 651 may be formed by removing a region corresponding to the open region on one insulating member through etching or physical punching.

However, it is important here that in the insulating layer 651 in the embodiment, a second open region OR2 is formed between the first insulating portion 651-1 and the second insulating portion 651-2, and the first insulating portion 651-1 and the second insulating portion 651-2 OR2 may be separated from each other without being connected to each other in the second open region.

The second insulating portion 651-2 may be disposed to surround the periphery of the first insulating portion 651-1 at a position spaced apart from the first insulating portion 651-1 by a predetermined distance through the second open region OR2. In this case, the first insulating portion 651-1 and the second insulating portion 651-2 may form a single layer structure disposed on the same plane.

The insulating layer 651 may have a thickness of 20 μm to 100 μm. For example, the insulating layer 651 may have a thickness of 25 μm to 50 μm. For example, the insulating layer 651 may have a thickness of 30 μm to 40 μm. When the thickness of the insulating layer 651 is greater than 100 μm, the overall thickness of the fourth substrate 650 may increase. When the thickness of the insulating layer 651 is less than 20 μm, the pattern portion 652 may not be stably supported. For example, when the thickness of the insulating layer 651 is less than 20 μm, it may be vulnerable to heat/pressure, etc. in the soldering process for bonding with the first substrate 630 or the third substrate 642, and accordingly, the bonding force with the first substrate 630 or the third substrate 642 may be reduced.

Meanwhile, although not shown in the drawings, at least one slit (not shown) may be formed on the first insulating portion 651-1. The slit may be formed to maintain the flatness of the first insulating portion 651-1. The slit reduces the weight of the insulating layer 651 and furthermore the fourth substrate 650 while maintaining flatness, thereby improving the overall reliability of the camera module.

A pattern portion 652 is disposed on one surface of the insulating layer 651.

The pattern portion 652 includes a first pattern portion 652a having a signal transmission function and a second pattern portion 652b separated from the first pattern portion 652a and for securing rigidity. The second pattern portion 652b may be referred to as a reinforcing pattern for securing rigidity of the fourth substrate 650. Meanwhile, although not shown in the drawing, an adhesive sheet (not shown) may be disposed between the insulating layer 651 and the pattern portion 652, and accordingly, the adhesive force between the insulating layer 651 and the pattern portion 652 may be improved.

The first pattern portion 652a includes a first lead pattern portion 652-1 disposed on the first insulating portion 651-1 of the insulating layer 651, a second lead pattern portion 652-2 disposed on the second insulating portion 651-2 of the insulating layer 651, and a connection pattern portion 652-3 disposed on the second open region OR2 between the first insulating portion 651-1 and the second insulating portion 651-2 and electrically connecting between the first lead pattern portion 652-1 and the second lead pattern portion 652-2. In this case, the connection pattern portion 652-3 is disposed on the second open region OR2 between the first insulating portion 651-1 and the second insulating portion 651-2.

The first lead pattern portion 652-1 may be respectively disposed on two side regions facing each other among the four side regions of the first insulating portion 651-1. That is, the first insulating portion 651-1 may include a left side region, a right side region, an upper side region, and a lower side region. In addition, the first lead pattern portion 652-1 may be disposed in the upper side region and the lower side region facing each other among the four side regions of the first insulating portion 651-1, respectively. In addition, the first lead pattern portion 652-1 may not be disposed in the left side region and the right side region of the side regions of the first insulating portion 651-1.

The second lead pattern portion 652-2 may be disposed in side regions different from the side regions in which the first lead pattern portion 652-1 is disposed among the four side regions of the second insulating portion 651-2.

That is, the second insulating portion 651-2 may include a left side region, a right side region, an upper side region, and a lower side region. In addition, the second lead pattern portion 652-2 may be respectively disposed on the left side region and the right side region facing each other among the four side regions of the second insulating portion 651-2. Also, the second lead pattern portion 652-2 may not be disposed in the upper and lower side regions of the side regions of the second insulating portion 651-2.

As described above, the first lead pattern portion 652-1 and the second lead pattern portion 652-2 may be disposed in different side regions of each of the first insulating portion 651-1 and the second insulating portion 651-2. That is, the first lead pattern portion 652-1 is disposed in the upper side region and the lower side region of the first insulating portion 651-1. Also, differently from this, the second lead pattern portion 652-2 is disposed on the left side region and the right side region of the second insulating portion 651-2. Accordingly, the first lead pattern portion 652-1 and the second lead pattern portion 652-2 may be disposed so as not to face each other in the second open region OR2 between the first insulating portion 651-1 and the second insulating portion 651-2. This may improve the reliability of the roll operation in the Z-axis of the image sensor module 400.

Here, the first lead pattern portion 652-1 may be an inner lead pattern portion connected to the sixth terminal portion 642-3 of the third substrate 642. In addition, the second lead pattern portion 652-2 may be an outer lead pattern portion connected to the first terminal portion 635 of the first substrate 630.

The first lead pattern portion 652-1 and the second lead pattern portion 652-2 may be connected to each other through a connection pattern portion 652-3. The connection pattern portion 652-3 may have one end connected to the first lead pattern portion 652-1 and the other end connected to the second lead pattern portion 652-2, and a region excluding the one end and the other end of the connection pattern portion may be positioned on the second open region OR2 between the first insulating portion 651-1 and the second insulating portion 651-2. That is, the connection pattern portion 652-3 may be disposed in a flying state on the second open region OR2 between the first insulating portion 651-1 and the second insulating portion 651-2. Here, the flying state means that the insulating layer 651 does not exist on at least a portion of the connection pattern portion 652-3, and accordingly, it may mean a state in which at least a portion of the connection pattern portion 652-3 is floating in the air.

In this case, the first lead pattern portion 652-1 is configured in plurality. Also, the second lead pattern portion 652-2 is configured in plurality. In addition, the connection pattern portion 652-3 may connect the plurality of first lead pattern portions 652-1 and the plurality of second lead pattern portions 652-2 in a 1:1 ratio.

In this case, the first lead pattern portion 652-1 may include 36 first lead patterns. Also, the second lead pattern portion 652-2 may include 36 second lead patterns. Accordingly, the connection pattern portion 652-3 also includes 36 connection patterns, and thus the first lead patterns and the second lead patterns may be connected.

The connection pattern portion 652-3 may be bent and disposed at least once on the second open region. That is, the connection pattern portion 652-3 may include at least one bent portion. The connection pattern portion 652-3 may be disposed to have a rotational structure on the second open region OR2.

For example, when the first lead pattern portion 652-1 and the second lead pattern portion 652-2 are disposed to face each other on the insulating layer 651, the connection pattern portion 652-3 may connect a straight line between the first lead pattern portion 652-1 and the second lead pattern portion 652-2 without the bent portion.

Unlike this, since the first lead pattern portion 652-1 and the second lead pattern portion 652-2 are not disposed to face each other in the embodiment, the connection pattern portion 652-3 includes the bent portion that is bent at least once. In addition, the bent portion of the connection pattern portion 652-3 may improve the elasticity of the connection pattern portion 652-3 and improve the rigidity of the connection pattern portion 652-3.

In this case, a length of the connection pattern portion 652-3 is greater than a width of the second open region OR2 between the first insulating portion 651-1 and the second insulating portion 651-2.

The connection pattern portion 652-3 may be formed by etching to have the shape as described above through methods an additive process, a subtractive process, a Modified Semi Additive Process (MSAP), and a Semi Additive Process (SAP). Preferably, the first lead pattern portion 652-1, the second lead pattern portion 652-2, and the connection pattern portion 652-3 are integrally formed with each other, and accordingly, it may be simultaneously formed by etching one metal layer.

Meanwhile, a thickness of the first pattern portion 652 including the first lead pattern portion 652-1, the second lead pattern portion 652-2, and the connection pattern portion 652-3 may be 10 μm to 50 μm. For example, the thickness of the first pattern portion 652 may be 30 μm to 40 μm. In this case, when the thickness of the first pattern portion 652 is less than 10 μm, the first pattern portion 652 may be broken during the shifting of the image sensor module 400. In addition, when the thickness of the first pattern portion 652 is greater than 50 μm, the elastic force of the connection pattern portion 652-3 may be decreased, and accordingly, the mobility of the image sensor module 400 may be hindered. Accordingly, the thickness of the first pattern portion 652 is 35 μm±5 μm, so that the image sensor module 400 can be stably shifted in the embodiment.

In addition, the length of the connection pattern portion 652-3 is greater than the width of the second open region OR2 between the first insulating portion 651-1 and the second insulating portion 651-2. Here, the width of the second open region OR2 may be a linear distance connecting the first insulating portion 651-1 and the second insulating portion 651-2 in a straight line.

In addition, the length of the connection pattern portion 652-3 is at least 1.5 times the linear distance. In addition, the length of the connection pattern portion 652-3 is set to be 20 times or less of the linear distance.

At this time, when the length of the connection pattern portion 652-3 is less than 1.5 times the linear distance, the shift operation of the image sensor module 400 may be affected due to the decrease in the elastic force of the connection pattern portion 652-3. In addition, when the length of the connection pattern portion 652-3 is greater than 20 times the linear distance, the resistance increases as the signal transmission distance increases corresponding to the length of the connection pattern portion 652-3, and accordingly, noise may be included in the signal transmitted through the connection pattern portion 652-3.

On the other hand, the first pattern portion 652 as described above is a wiring that transmits an electrical signal, and may be formed of a metal material having high electrical conductivity. To this end, the first pattern portion 652 may be formed of at least metal material selected from gold (Au), silver (Ag), platinum (Pt), titanium (Ti), tin (Sn), copper (Cu), and zinc (Zn). In addition, the first pattern portion 652 may be formed of a paste or solder paste including at least one metal material selected from gold (Au), silver (Ag), platinum (Pt), titanium (Ti), tin (Sn), copper (Cu), and zinc (Zn) having excellent bonding strength.

Preferably, the first pattern portion 652 may be formed of a metallic material having an elastic force that enables shifting in the X-axis, Y-axis, and Z-axis directions of the image sensor module 400 disposed on the coil moving substrate portion 640 on the fourth substrate 650 while serving as a wiring for transmitting an electrical signal. To this end, the first pattern portion 652 may be formed of a metal material having a tensile strength of 1000 MPa or more. For example, the first pattern portion 652 may be a binary alloy or a ternary alloy including copper. For example, the first pattern portion 652 may be a binary alloy or a ternary alloy including at least one selected from nickel (Ni), tin (Sn), beryllium (Be), and cobalt (Co) and copper (Cu). The first pattern portion 652 may be formed of an alloy such as iron (Fe), nickel (Ni), zinc, etc. having good electrical properties while having an elastic force capable of serving as a spring. Also, the first pattern portion 652 may be surface-treated with a plating layer including a metal material such as gold (Au), silver (Ag), palladium (Pd), and the like, thereby improving electrical conductivity.

The second pattern portion 652b may be selectively disposed on one surface of the insulating layer 651 in a region where the first pattern portion 652 is not disposed.

The second pattern portion 652b may include a first reinforcing pattern 652-4 disposed on the first insulating portion 651-1, a second reinforcing pattern 652-5 disposed on the second insulating portion 651-2, and a third reinforcing pattern 652-6 disposed on the second open region OR2 and connecting the first reinforcing pattern 652-4 and the second reinforcing pattern 652-5.

The first reinforcing pattern 652-4 may be disposed on a left side region and a right side region of the first insulating portion 651-1.

In addition, the second reinforcing pattern 652-5 may be disposed on one surface of the second insulating portion 651-2 in a region where the second lead pattern portion 652-2 is not disposed.

In addition, the second reinforcing pattern 652-5 includes a first part disposed on the upper surface of the second insulating portion 651-2, and a second part extending from the first part and disposed outside the second insulating portion. The second part of the second reinforcing pattern portion 652b may be disposed to extend outside the second insulating portion 651-2 in order to maintain the flatness of the second substrate 641 while securing the rigidity of the second substrate 641. In addition, at least one coupling hole 652-7 may be formed in the second part of the second reinforcing pattern 652-5. Accordingly, although not shown in the drawing, a coupling protrusion (not shown) corresponding to the coupling hole 652-7 may be disposed on the first substrate 630, and accordingly, the bonding force between the fourth substrate 650 and the first substrate 630 may be improved.

Meanwhile, the second pattern portion 652b may be formed of the same metal material as that of the first pattern portion 652. Preferably, the second pattern portion 652b may be formed together with the first pattern portion 652 in the same process.

Meanwhile, the first insulating portion 651-1, the first lead pattern portion 652-1, and the first reinforcing pattern 652-4 of the fourth substrate 650 may be a moving portion that moves together with the coil moving substrate portion 640.

In addition, the second insulating portion 651-2, the second lead pattern portion 652-2 and the second reinforcing pattern 652-5 of the fourth substrate 650 may be a fixed portion fixed on the first substrate 630.

In addition, the connection pattern portion 652-3 of the fourth substrate 650 may be a metal pattern having an elastic force that enables the shift of the image sensor module 400 while transmitting a signal.

In addition, the third reinforcing pattern 652-6 of the fourth substrate 650 may have an elastic force that enables the shift of the image sensor module 400 together with the connection pattern portion 652-3.

Meanwhile, a line width of the first lead pattern portion 652-1 may be the same as a line width of the second lead pattern portion 652-2.

In addition, a line width of the connection pattern portion 652-3 may be smaller than the line width of the first lead pattern portion 652-1 and the second lead pattern portion 652-2.

At this time, a buffer portion gradually decreases in width, has a rounded side surface rather than a straight line, and may be formed between the first lead pattern portion 652-1 and the connection pattern portion 652-3 and between the second lead pattern portion 652-2 and the connection pattern portion 652-3.

That is, side surfaces of both ends of the connection pattern portion 652-3 may have a curvature. At this time, when the side surfaces of both ends of the connection pattern portion 652-3 have a straight shape, stress may be concentrated in the side surface of the connection pattern portion, and accordingly, a disconnection phenomenon in which the connection pattern portion 652-3 is separated from the first lead pattern portion 652-1 or the second lead pattern portion 652-2 may occur.

Accordingly, the end of the connection pattern portion 652-3 has a rounded side surface to prevent stress from being concentrated at the end.

At this time, a value of the curvature R of the side surface of the end of the connection pattern portion 652-3 is set to have a value between 30 and 100. When the value of the curvature (R) of the side surface is less than 30, the stress concentration prevention effect is insignificant, and when it is greater than 100, the elastic force of the connection pattern portion 652-3 may be reduced.

Here, the line width of the connection pattern portion 652-3 may have a line width of 20 to 1000 μm. When the line width of the connection pattern portion 652-3 is less than 20 μm, the overall rigidity of the connection pattern portion 652-3 may decrease, thereby reducing reliability. In addition, when the line width of the connection pattern portion 652-3 is greater than 1000 μm, the elastic force of the connection pattern portion 652-3 is reduced, and thus a problem may occur in shifting of the image sensor module 400.

Meanwhile, the first lead pattern portion 652-1 may include a first-first lead pattern part 652-1a disposed on the first insulating portion 651-1 of the insulating layer 651, and a first-second lead pattern part 652-1b extending from the first-first lead pattern part 652-1a and protruding inward of the first insulating portion 651-1. The first-second lead pattern part 652-1b is disposed to protrude from the first insulating portion 651-1, and accordingly, it is possible to provide the ease of a soldering process performed for coupling with the sixth terminal portion 642-3 of the third substrate 642.

The second lead pattern portion 652-2 may include a second-first lead pattern part 652-2a disposed on the second insulation portion 651-2 of the insulation layer 651, and a second-second lead pattern part 652-2b extending from the second-first lead pattern part 652-2a and protruding outward of the first insulating portion 651-2. The second-second lead pattern part 652-2b is disposed to protrude outward from the second insulating portion 651-2, and accordingly, it is possible to provide the ease of a soldering process performed for coupling with the first terminal portion 635 of the first substrate 630.

Meanwhile, the insulating layer 651 may include a third insulating portion 651-3 disposed on the second open region OR2 between the first insulating portion 651-1 and the second insulating portion 651-2.

The third insulating portion 651-3 may be disposed on the connection pattern portion 652-3. The third insulating portion 651-3 may serve to increase the rigidity of the connection pattern portion 652-3.

In addition, a shape of the connection pattern portion 652-3 is changed during the operation of the image sensor module 400, and accordingly, different connection pattern portions may be in contact with each other. Accordingly, the third insulating portion 651-3 may be disposed on the connection pattern portion 652-3 to maintain a gap between the connection pattern portions 652-3. That is, the third insulating portion 651-3 may be formed to solve a short circuit problem that may occur as the plurality of connection pattern parts 652-3 come into contact with each other during the shift operating of the image sensor module 400.

To this end, the third insulating portion 651-3 may be commonly disposed on a plurality of different connection pattern portions 652-3. Preferably, the third insulating portion 651-3 may be disposed on the bent portion of the plurality of different connection pattern portions 652-3. That is, the bent portion of the connection pattern portion 652-3 may have lower rigidity, and accordingly, the third insulating portion 651-3 may improve the rigidity of the bent portion while solving the short circuit problem.

<Image Sensor Module>

FIG. 15 is an exploded perspective view of an image sensor module 400 according to an embodiment.

Referring to FIG. 15, the image sensor module 400 may include a filter 440, the adhesive member 440, a sensor base 410, the image sensor 430, and an image sensor substrate 420.

The image sensor module 400 includes the sensor base 410.

The sensor base 410 may include an opening 411, and a stepped protrusion may be provided to allow the filter 440 to be seated adjacent to the opening 411. In addition, the adhesive member may be disposed on the stepped protrusion, and the filter 440 may be fixedly disposed on the adhesive member. Such a filter 440 may serve to block light of a specific frequency band of light passing through the lens module 100 from being incident on the image sensor 430. The filter 440 may be disposed to be parallel to an x-y plane. The filter 440 may be disposed between the lens module 100 and the image sensor 430. The filter 440 may include an infrared filter. The infrared filter may absorb or reflect infrared light incident on the infrared filter.

The image sensor substrate 420 may be a package substrate. That is, the image sensor 430 may be mounted in a package form on the image sensor substrate 420. The image sensor substrate 420 may include a printed circuit board (PCB). The image sensor substrate 420 may include a circuit substrate. The image sensor 430 may be disposed on the image sensor substrate 420. The image sensor substrate 420 may be coupled to the second substrate 641. To this end, a seventh terminal portion 421 electrically connected to the fourth terminal portion 641-7 of the second substrate 641 may be provided on a lower surface of the image sensor substrate 420. In this case, as described above, the seventh terminal portion 421 is also disposed at edge regions opposite to each other on the lower surface of the image sensor substrate 420, and accordingly, positions of the pads to which the image signal is transmitted can be separated from the other pads. Meanwhile, the image sensor substrate 420 may be positioned within the opening of the second substrate 641, and the seventh terminal portion 421 may be arranged in the opening of the second substrate 641 in a horizontal direction with the fourth terminal portion 641-7 of the second substrate 641. In addition, the fourth terminal portion 641-7 and the seventh terminal portion 421 may be coupled to each other through soldering or the like. At this time, the adhesive member by soldering is omitted in the drawing, the seventh terminal portion 421 and the fourth terminal portion 641-7 may be spaced apart before the soldering process, and the seventh terminal portion 421 and the fourth terminal portion 641-7 may be electrically connected to each other through a soldering process.

The image sensor 430 may have a configuration in which light passing through the lens module 100 and the filter 440 is incident to form an image. The image sensor 430 may be mounted on the image sensor substrate 420. The image sensor 430 may be electrically connected to the image sensor substrate 420. For example, the image sensor 430 may be coupled to the image sensor substrate 420 by surface mounting technology (SMT). As another example, the image sensor 430 may be coupled to the image sensor substrate 420 by flip chip technology. The image sensor 430 may be disposed to coincide with the lens module 100 in an optical axis. That is, the optical axis of the image sensor 430 and the optical axis of the lens module 100 may be aligned. The image sensor 430 may convert light irradiated to the effective image region of the image sensor 430 into an electrical signal. In addition, the converted electrical signal may be an image signal. The image sensor 430 may be any one of a charge coupled device (CCD), a metal oxide semi-conductor (MOS), a CPD, and a CID.

<Image Sensor Module Shift Driving Operation>

Hereinafter, a shift operation of the image sensor module 400 will be described.

FIG. 16*a* is a view for explaining x-axis direction shift driving through some configurations of the camera device according to the present embodiment, FIG. 16*b* is a view for explaining y-axis direction shift driving through some configurations of the camera device according to the present embodiment, FIG. 16*c* is a view for explaining z-axis rotational driving through some configurations of the camera device according to the present embodiment, and FIG. 17 is a view showing a magnetic flow and a Lorentz force between a magnet and a coil of the camera device according to the present embodiment.

As shown in FIG. 16*a*, when currents in the same direction are applied to the second coil 641-2*b* and the fourth coil 623-2*d* in the present embodiment, the image sensor 430 coupled to the image sensor module 400 may be moved (shifted) in the x-axis direction by electromagnetic interaction between the second magnet 623-2 and the fourth magnet 623-4, respectively. That is, the second coil 641-2*b*, the second magnet 623-2, and the fourth coil 623-2*d* and the fourth magnet 623-4 may be used for the x-axis direction shift drive of the image sensor 430. In this case, the second coil 641-2*b* and the second magnet 623-2 may be a first x-axis shift driver X1, and the fourth coil 623-2*d* and the fourth magnet 623-4 may be a second x-axis shift driver X2.

As shown in FIG. 16*b*, when currents in the same direction are applied to the first coil 641-2*a* and the third coil 641-2*c* the present embodiment, the image sensor 430 coupled to the image sensor module 400 may be moved (shifted) in the y-axis direction by electromagnetic interaction between the first magnet 623-1 and the third magnet 623-3, respectively. That is, the first coil 641-2*a*, the first magnet 623-1, the third coil 641-2*c*, and the third magnet 623-3 may be used for the y-axis direction shift drive of the image sensor 430. In this case, the first coil 641-2*a* and the first magnet 623-1 may be a first y-axis shift driver Y1, and the third coil 641-2*c* and the third magnet 623-3 may be a second y-axis shift driver Y2.

As shown in FIG. 16*c*, currents in opposite directions are applied to the first coil 641-2*a* and the third coil 623-2*c* and currents in opposite directions are applied to the second coil 641-2*b* and the fourth coil 641-2*d* in the present embodiment, and at this time, when a direction in which the coil portion 641-2 is rotated by the current applied to the second coil 641-2*b* and the current applied to the first coil 641-2*a* is the same, the image sensor 430 coupled to the image sensor module 400 may be rotated (rolled) around the z-axis. An embodiment shown in FIG. 16*c* illustrates a case in which the coil portion 641-2 is controlled by four channels, and when the coil portion 641-2 is controlled by three channels, the image sensor 430 may be rolled by the first coil 641-2*a* and the third coil 623-2*c* or the second coil 641-2*b* and the fourth coil 641-2*d*. This is because when there is a coil combined into one channel among the first coil 641-2*a* and the third coil 623-2*c*, and the second coil 641-2*b* and the fourth coil 641-2*d*, the current may not be applied in the opposite direction.

In the present embodiment, a magnetic flow of the magnet portion 623 is shown in FIG. 17. Referring to FIG. 17, it may be confirmed that lines of magnetic force passing perpendicular to the coil portion 641-2 exists, and when a current is applied to the coil portion 641-2 in this state, the coil portion 641-2 may move with respect to the magnet portion 623 by the Lorentz force.

<Shift Reliability Evaluation>

FIG. 18 (*a*) is a view showing the reliability evaluation result of the camera module according to the comparative example, and FIG. 18 (*b*) is a view showing the reliability evaluation result of the camera module according to the embodiment.

In the embodiment, the coil moving substrate portion 640 is connected to the first lead pattern portion 652-1 disposed on the first insulating portion 651-1 of the fourth substrate 650, the image sensor module 400 is coupled to the coil moving substrate portion 640, and these are shifted by the elastic force provided through the connection pattern portion 652-3 of the fourth substrate 650.

In this case, the connection pattern portion 652-3 is arranged in a direction horizontal to the optical axis direction to enable the shift of the image sensor module 400.

Here, when the shift operation of the image sensor module 400 is performed only with the connection pattern portion 652-3, the connection pattern portion 652-3 may be tilted in the optical axis direction when the image sensor module 400 is shifted.

That is, it was confirmed that the image sensor module 400 is tilted in the optical axis direction during the operation of shifting the image sensor module 400 in the x-axis direction as shown in (a) of FIG. 18. That is, it was confirmed that one side of the coil moving substrate portion 640 on which the image sensor module 400 is disposed moves in an upward direction in which a first tilt (tilt 1) occurs, and the other side of the coil moving substrate portion 640 moves in a downward direction in which a second tilt (tilt 2) occurs. In addition, the first and second tilts tilt 1 and 2 as described above may affect the reliability of the shift operation of the image sensor module 400.

On the other hand, as shown in (b) of FIG. 18, the embodiment includes a connection wire having one end connected to the damping plate included in the holder part and the other end connected to the coil moving substrate portion 640. In addition, the connection wire is disposed in the optical axis direction in the camera device. Accordingly, the connection wire is prevented from being tilted upward or downward during the shift operation of the coil moving substrate portion 640. That is, the connection wire supports the coil moving substrate portion 640, and accordingly, a sagging phenomenon of the coil moving substrate portion 640 occurring during the shift operation is prevented.

Meanwhile, the camera device according to the above embodiment may be provided in an optical device. Here, the optical device may be any one of a mobile phone and a portable phone, a smart phone, a portable smart device, a digital camera, a laptop computer, a digital broadcasting terminal, a personal digital assistant (PDA), a portable multimedia player (PMP), and navigation. However, the type of optical device is not limited thereto, and any device for taking an image or photo may be included in the optical device.

The invention claimed is:

1. A substrate comprising:
   an insulating layer including a first insulating portion including a first open region; and
   a second insulating portion, wherein a second open region is between the first insulating portion and the second insulating portion, and
   a first pattern portion and a second pattern portion disposed on the insulating layer, wherein the first pattern portion includes:
a first lead pattern portion disposed on the first insulating portion;
a second lead pattern portion disposed on the second insulating portion; and
a connection pattern disposed on the second open region and connected to the first and second lead pattern portions, and
wherein the second pattern portion includes:
a second reinforcing pattern disposed on the second insulating portion and spaced apart from the second lead pattern portion.

2. The substrate of claim 1, further comprising a second pattern portion on the insulating layer,
wherein the first pattern portion is a signal transmission pattern, and
wherein the second pattern portion is a reinforcing pattern physically separated from the first pattern portion.

3. The substrate of claim 1, wherein the first lead pattern portion is disposed on the first insulating portion in a first direction, and
wherein the second lead pattern portion is disposed on the second insulating portion in a second direction orthogonal to the first direction.

4. The substrate of claim 1, wherein a length of the connection pattern portion is greater than a linear distance between the first lead pattern portion and the second lead pattern portion.

5. The substrate of claim 1, wherein a length of the connection pattern portion is greater than a width of the second open region.

6. The substrate of claim 5, wherein the length of the connection pattern portion has a range of 1.5 to 20 times a linear distance between an outer side of the first insulating part and an inner side of the second insulating portion.

7. The substrate of claim 1, wherein the connection pattern portion is disposed on the second open region without contacting the insulating layer.

8. The substrate of claim 1, wherein the first lead pattern portion includes:
a first-first lead pattern part disposed on the first insulating portion; and
a first-second lead pattern part extending from the first-first lead pattern part toward the first open region and not overlapping the insulating layer in a thickness direction.

9. The substrate of claim 1, wherein the second lead pattern portion includes:
a second-first lead pattern part disposed on the second insulating portion; and
a second-second lead pattern part extending outwardly from the second-first lead pattern part and not in contact with the second insulating portion.

10. The substrate of claim 8, wherein the first-second lead pattern part does not contact the insulating layer.

11. The substrate of claim 1, wherein the connection pattern portion has one end connected to the first lead pattern portion and the other end connected to the second lead pattern portion, and
wherein a side surface of each of the one end and the other end of the connection pattern portion has a curved surface.

12. The substrate of claim 11, wherein a curvature (R) of the side surface of the one end and the other end has a range between 30 and 100.

13. The substrate of claim 2, wherein the second pattern portion includes:

a first reinforcing pattern disposed on the first insulating portion and spaced apart from the first lead pattern portion;
a second reinforcing pattern disposed on the second insulating portion and spaced apart from the second lead pattern portion; and
a third reinforcing pattern disposed on the second open region to connect between the first reinforcing pattern and the second reinforcing pattern, and spaced apart from the connection pattern portion.

14. The substrate of claim 13, wherein the second reinforcing pattern includes:
a second-first reinforcing pattern part disposed on the second insulating portion; and
a second-second reinforcing pattern part extending from the second-first reinforcing pattern part and disposed outside the second insulation portion and not in contact with the second insulation portion.

15. The substrate of claim 14, wherein the second-second reinforcing pattern part includes at least one coupling hole.

16. The substrate of claim 1, wherein the insulating layer includes a third insulating portion disposed on the second open region and in contact with the connection pattern portion,
wherein the connection pattern portion includes a bent portion disposed on a corner of the second open region, and
wherein the third insulating portion is disposed on the corner of the second open region and overlaps the bent portion of the connection pattern portion in a thickness direction.

17. The substrate of claim 16, wherein the third insulating portion includes:
a third-first insulating part overlapping the connection pattern portion in a thickness direction; and
a third-second insulating part disposed on the second open region that does not overlap the connection pattern portion in the thickness direction.

18. A sensor driving device comprising:
a fixed portion including a holder portion including a holder, a magnet portion coupled to the holder, and a damping plate disposed on the holder, and a first substrate including a first terminal portion;
a coil moving substrate portion spaced apart from the fixed portion and including a coil portion facing the magnet and a sensor;
a fourth substrate including a moving part connected to the coil moving substrate portion and a fixed part connected to the first substrate, the fourth substrate moving the sensor by electromagnetic force generated from the magnet portion and the coil portion; and
a wire having one end connected to the damping plate of the fixed portion and the other end connected to the coil moving substrate portion and elastically supporting the coil moving substrate portion,
wherein the fourth substrate includes
an insulating layer including a first insulating portion including a first open region and a second insulating portion spaced apart from the first insulating portion with a second open region interposed therebetween; and
a first pattern portion disposed on the insulating layer,
wherein the first pattern portion includes:
a first lead pattern portion disposed on the first insulating portion;
a second lead pattern portion disposed on the second insulating portion; and a connection pattern portion disposed on the second open region and connected to the first and second lead pattern portions, wherein the first lead pattern portion includes a non-overlap part that does not overlap the insulating layer in an optical axis direction, and wherein the sensor is disposed on the non-overlap part of the first lead pattern portion.

19. The sensor driving device of claim 18, further comprising a sensor substrate on which the sensor is disposed, wherein the coil moving substrate portion includes an opening in which the sensor substrate is disposed, and wherein the sensor substrate overlaps the non-overlap part of the first lead pattern portion in the optical axis direction.

20. The sensor driving device of claim 18, wherein each of the holder and the coil moving substrate portion includes a through hole aligned in the optical axis direction and through which the wire passes.

* * * * *